(12) United States Patent
Taylor

(10) Patent No.: US 11,799,268 B2
(45) Date of Patent: Oct. 24, 2023

(54) SEMICONDUCTOR INTEGRATED CIRCUIT AND METHODOLOGY FOR MAKING SAME

(71) Applicant: Geoff W. Taylor, Wilton, NH (US)

(72) Inventor: Geoff W. Taylor, Wilton, NH (US)

(*) Notice: Subject to any disclaimer, the term of this patent is extended or adjusted under 35 U.S.C. 154(b) by 20 days.

(21) Appl. No.: 17/408,424

(22) Filed: Aug. 21, 2021

(65) Prior Publication Data

US 2022/0059993 A1    Feb. 24, 2022

Related U.S. Application Data

(60) Provisional application No. 63/069,551, filed on Aug. 24, 2020.

(51) Int. Cl.
| | |
|---|---|
| *H01S 5/00* | (2006.01) |
| *H01S 5/062* | (2006.01) |
| *H01S 5/20* | (2006.01) |
| *H01S 5/183* | (2006.01) |

(Continued)

(52) U.S. Cl.
CPC .......... *H01S 5/06203* (2013.01); *H01S 5/026* (2013.01); *H01S 5/0424* (2013.01); *H01S 5/18308* (2013.01); *H01S 5/18372* (2013.01); *H01S 5/2027* (2013.01)

(58) Field of Classification Search
CPC .... H01S 5/06203; H01S 5/026; H01S 5/0424; H01S 5/18308; H01S 5/18372; H01S 5/2027
See application file for complete search history.

(56) References Cited

U.S. PATENT DOCUMENTS

| | | |
|---|---|---|
| 6,031,243 A | 2/2000 | Taylor |
| 6,479,844 B2 | 11/2002 | Taylor |
| 6,841,795 B2 | 1/2005 | Taylor et al. |

(Continued)

FOREIGN PATENT DOCUMENTS

WO    02/017490 A1    9/2002

OTHER PUBLICATIONS

PCT Search Report and Written Opinion dated Nov. 23, 2021 of International Application No. PCT/US 21/47101.

(Continued)

*Primary Examiner* — Kinam Park
(74) *Attorney, Agent, or Firm* — GORDON & JACOBSON, P.C.

(57) ABSTRACT

Integrated circuitry is fabricated from semiconductor layers formed on a substrate, which include at least one n-type layer, an inverted p-type modulation doped quantum well (mod-doped QW) structure, a non-inverted n-type mod-doped QW structure, and at least one p-type layer including a first P+-type layer formed below a second P-type layer. An etch operation exposes the second p-type layer. P-type ions are implanted into the exposed second p-type layer. A gate electrode of a n-channel HFET device is formed in contact with the p-type ion implanted region. Source and drain electrodes of the n-channel HFET device are formed in contact with n-type ion implanted regions formed in contact with the n-type mod-doped QW structure. P-channel HFET devices, complementary BICFET devices, stacked complementary HFET devices and circuits and/or logic gates based thereon, and a variety of optoelectronic devices and optical devices can also be formed as part of the integrated circuitry.

26 Claims, 48 Drawing Sheets

N-N BICFET Z-Z' Cross-section

(51) Int. Cl.
H01S 5/042 (2006.01)
H01S 5/026 (2006.01)

(56) References Cited

U.S. PATENT DOCUMENTS

| | | |
|---|---|---|
| 6,849,866 B2 | 2/2005 | Taylor |
| 6,853,014 B2 | 2/2005 | Taylor et al. |
| 6,870,207 B2 | 3/2005 | Taylor |
| 6,873,273 B2 | 3/2005 | Taylor et al. |
| 6,954,473 B2 | 10/2005 | Dehmubed et al. |
| 6,995,407 B2 | 2/2006 | Taylor et al. |
| 7,332,752 B2 | 2/2008 | Taylor et al. |
| 9,082,637 B2 | 7/2015 | Taylor |
| 9,625,647 B2 | 4/2017 | Taylor |
| 10,038,302 B2 | 7/2018 | Taylor |
| 2004/0079971 A1 | 4/2004 | Taylor |
| 2004/0081216 A1* | 4/2004 | Dehmubed ............ H03M 1/667 257/E21.387 |
| 2009/0003399 A1 | 1/2009 | Taylor |
| 2016/0025926 A1 | 1/2016 | Taylor |
| 2016/0365475 A1 | 12/2016 | Taylor |
| 2016/0365476 A1 | 12/2016 | Taylor |
| 2017/0221995 A1* | 8/2017 | Taylor ................ H01L 27/1443 |

OTHER PUBLICATIONS

U.S. Appl. No. 60/376,238, filed Apr. 26, 2002.
U.S. Appl. No. 08/949,504, filed Oct. 14, 1997.
U.S. Appl. No. 09/710,217, filed Nov. 10, 2000.

* cited by examiner

NHFET X-X' Section

2 INPUT NAND GATE
with Stacked Complementary HFETs

2-INPUT NOR GATE
with Stacked Complementary HFETs

SEMICONDUCTOR INTEGRATED CIRCUIT AND METHODOLOGY FOR MAKING SAME

CROSS-REFERENCE TO RELATED APPLICATION(S)

The present application claims priority from U.S. Provisional Appl. No. 63/069,551 filed on Aug. 24, 2020, herein incorporated by reference in its entirety.

BACKGROUND

1. Field

The present application relates to semiconductor integrated circuits that implement electronic functions (such as heterojunction field effect transistors) and optoelectronic functions (such as optical emitters, optical detectors and optical switches, active waveguides) and optical functions (such as passive waveguides and couplers) as well as fabrications methods for such integrated circuits.

2. State of the Art

The present application builds upon technology (referred to as "Planar Optoelectronic Technology" or "POET") that provides for the realization of a variety of devices (optoelectronic devices, logic circuits and/or signal processing circuits) utilizing inversion quantum-well channel device structures as described in detail in U.S. Pat. No. 6,031,243; U.S. patent application Ser. No. 09/556,285, filed on Apr. 24, 2000; U.S. patent application Ser. No. 09/798,316, filed on Mar. 2, 2001; International Application No. PCT/US02/06802 filed on Mar. 4, 2002; U.S. patent application Ser. No. 08/949,504, filed on Oct. 14, 1997, U.S. patent application Ser. No. 10/200,967, filed on Jul. 23, 2002; U.S. application Ser. No. 09/710,217, filed on Nov. 10, 2000; U.S. Patent Application No. 60/376,238, filed on Apr. 26, 2002; U.S. patent application Ser. No. 10/323,390, filed on Dec. 19, 2002; U.S. patent application Ser. No. 10/280,892, filed on Oct. 25, 2002; U.S. patent application Ser. No. 10/323,390, filed on Dec. 19, 2002; U.S. patent application Ser. No. 10/323,413, filed on Dec. 19, 2002; U.S. patent application Ser. No. 10/323,389, filed on Dec. 19, 2002; U.S. patent application Ser. No. 10/323,388, filed on Dec. 19, 2002; U.S. patent application Ser. No. 10/340,942, filed on Jan. 13, 2003; U.S. patent application Ser. No. 13/921,311, filed on Jun. 19, 2013; and U.S. patent application Ser. No. 14/222,841, filed on Mar. 24, 2014; and U.S. patent application Ser. No. 15/450,400 filed Mar. 6, 2017, all of which are hereby incorporated by reference in their entireties.

With these structures, a fabrication sequence can be used to make the devices on a common substrate. In other words, n type and p type contacts, critical etches, etc. can be used to realize all of these devices simultaneously on a common substrate. The essential features of this device structure include 1) an n-type modulation doped interface and a p-type modulation doped quantum well interface, 2) self-aligned n-type and p-type channel contacts formed by ion implantation, 3) n-type metal contacts to the n-type channel contacts formed by ion implantation and to the bottom n-type layer structure, and 4) p-type metal contacts to the p-type channel contacts formed by ion implantation and to the top p-type layer structure. The active device structures are preferably realized with a compound semiconductor system of group III-V materials (such as a GaAs/AlGaAs).

POET can be used to construct a variety of optoelectronic devices. POET can also be used to construct a variety of high performance transistor devices, such as complementary NHFET and PHFET unipolar field effect transistors. The NHFET transistors employ the n-type modulation doped quantum well interface, which includes an n-type charge sheet disposed above one or more quantum wells. The quantum well(s) form an active channel for conduction of electron charge carriers between source and drain electrode terminals. A heavily doped p-type layer spaced above the n-type charge sheet forms a gate region that applies an electric field that controls the flow of the electron charge carries through the active channel formed by the quantum well(s). Low-resistance electrical contact to the gate region is provided by controlled etching operations that etch down and stop at the heavily doped p-type layer. Controlling these etching operations can be difficult. An etch stop layer can be disposed above the heavily doped p-type layer. Drying etching is performed down very close to the etch stop layer. Wet etching is then used to etch down and stop at the etch stop layer. Then a separate wet etching operation is used to remove remaining parts of the etch stop layer and expose the heavily doped p-type layer. These dry and wet etching procedures can be difficult to control to effectively remove the etch stop layer and expose the heavily doped p-type layer due to issues with choice of etchants (e.g., acids), control of etch temperature and reliability of the selectivity of the etchants.

SUMMARY

Methods of forming an integrated circuit and the resulting integrated circuitry employ a plurality of semiconductor layers formed on a substrate including i) at least one n-type layer, ii) an inverted p-type modulation doped quantum well structure formed above the at least one n-type layer, iii) a non-inverted n-type modulation doped quantum well structure formed above the inverted p-type modulation doped quantum well structure, and iv) at least one p-type layer disposed above the non-inverted n-type modulation doped quantum well structure, wherein the at least one p-type layer includes a first p-type layer of relatively higher concentration of p-type doping formed below a second p-type layer of relatively lower concentration of p-type doping. An etch operation (E1) into the plurality of semiconductor layers exposes a portion of the second p-type layer. P-type ions are implanted into the exposed second p-type layer to form a p-type gate implanted region in contact with the first p-type layer. An n-type source ion implanted region and an n-type drain ion implanted region are formed in contact with the non-inverted n-type modulation doped quantum well structure. A gate electrode of a n-channel HFET device is formed in contact with the p-type gate ion implanted region. Source and drain electrodes of the n-channel HFET device are formed in contact with the n-type source ion implanted region and the n-type drain ion implanted region, respectively. P-channel HFET devices, complementary BICFET devices, stacked complementary HFET devices and circuits and/or logic gates based thereon, and a variety of optoelectronic devices and optical devices can also be formed as part of the integrated circuit.

In embodiments described above, p-type ion implants are used to contact to the gate region and/or back gate region of the N-channel HFET devices, and n-type ion implants are used to contact to the gate region and/or back gate region of the P-channel HFET devices. These implant operations can be effectively controlled and aid in minimizing gate resistance for high performance operation of the complementary HFET devices.

DETAILED DESCRIPTION OF THE PREFERRED EMBODIMENTS

Figure 1:
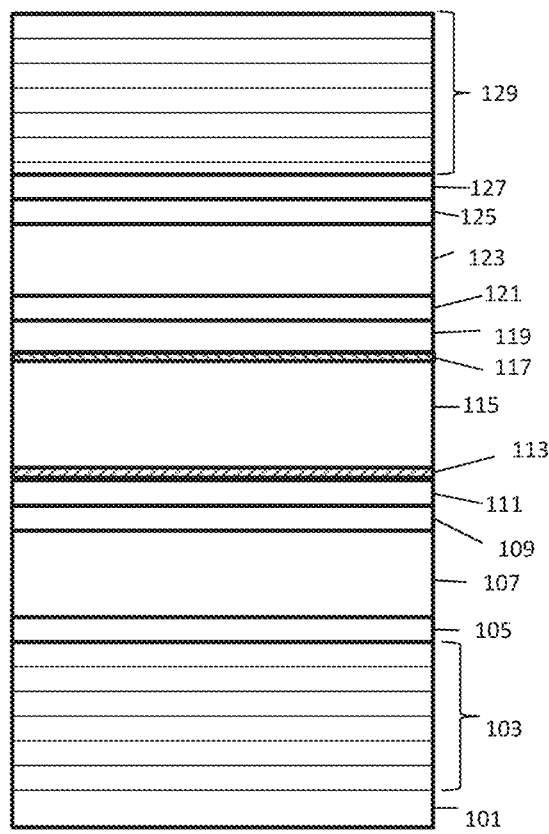
FIG. 1 is a schematic illustration of an exemplary epitaxial semiconductor layer structure for integrated circuit device structures described herein.

Turning now to FIG. 1, an epitaxial semiconductor layer structure of the present application includes bottom mirror layers 103 formed on a substrate 101, such as a substrate realized from a compound semiconductor such as gallium arsenide (GaAs) or other suitable substrate. The bottom mirror layers 103 can form a distributed Bragg reflector (DBR) mirror which is typically constructed by epitaxial deposition of pairs of semiconductor or dielectric materials with different refractive indices. When two materials with different refractive indices are placed together to form a junction, light will be reflected at the junction. The amount of light reflected at one such boundary is small. However, if multiple junctions/layer pairs are stacked periodically with each layer having a quarter-wave ($\lambda/4$) optical thickness, the reflections from each of the boundaries will be added in phase to produce a large amount of reflected light (e.g., a large reflection coefficient) at the particular center wavelength kc. Deposited upon the bottom mirror layers 103 is the active device structure suitable for realizing complementary heterostructure field-effect transistor (HFET) devices, possibly other electronic devices, optoelectronic devices, and optical devices.

First, one or more heavily doped n-type layer(s) 105 are formed on the bottom mirror layers 103. The heavily doped n-type layer(s) 105 has n-type doping of a concentration of at least $3.5e18$ cm$^{-3}$, which causes an increase in electrical conduction such that the layer(s) 105 have metallic like characteristics. The heavily doped n-type layer(s) 105 can provide a bottom n-type ohmic contact region for terminals (e.g., cathode terminals) of optoelectronic devices. One or more lightly doped n-type layer(s) 103 are formed on the heavily doped n-type layer(s) 105. The lightly doped n-type layer(s) 103 has n-type doping of a concentration in the range between $5e16$ cm$^{-3}$ and $5e17$ cm$^{-3}$. The lightly doped n-type layer(s) 103 provide for isolation between the bottom n-type ohmic contact region and the layers there above and also low capacitance for the P-channel HFET source and drain regions. Layers for a p-channel HFET (or PHFET) are formed on or above the lightly doped n-type layer(s) 103. The layers for the p-channel HFET include a heavily doped n-type layer 109, an undoped spacer layer 111 and inverted p-type modulation doped quantum well (QW) structure 113. The heavily doped n-type layer(s) 109 has n-type doping of a concentration of at least $3.5e18$ cm$^{-3}$. The heavily doped n-type layer 109 forms the gate region of the p-channel HFET. The undoped spacer layer 111 provides a capacitor layer between the heavily doped n-type layer 109 and the inverted p-type modulation doped QW structure 113. The inverted p-type modulation doped QW structure 113 includes a thin P+ doped charge sheet formed below one or more QWs with an undoped spacer layer therebetween. The P+ doped charge sheet has p-type doping of a concentration of at least $7e18$ $cm^{-3}$.

One or more undoped spacer layers 115 can be formed on or above the inverted p-type modulation doped QW structure 113.

Layers for an n-channel HFET (or NHFET) are formed on or above the spacer layer(s) 115. The layers for the n-channel HFET include a non-inverted n-type modulation doped QW structure 117, an undoped spacer layer 119, and a heavily doped p-type layer 121. The non-inverted n-type modulation doped QW structure 117 includes a thin N+ doped charge sheet formed above one or more QWs with an undoped spacer layer therebetween. The N+ doped charge sheet has n-type doping of a concentration of at least $3.5e18$ $cm^{-3}$. The undoped spacer layer 119 provides a capacitor layer between the non-inverted n-type modulation doped QW structure 117 and the heavily doped p-type layer 121. The heavily doped p-type layer 121 has p-type doping of a concentration of at least $7e18$ $cm^{-3}$. The heavily doped p-type layer 121 forms the gate region of the n-channel HFET.

The non-inverted n-type modulation doped QW structure 117 and the undoped spacer layer(s) 115 forms the back-gate (or collector) region of the p-channel HFET. Similarly, the inverted p-type modulation doped QW structure 113 and the undoped spacer layer(s) 115 forms the back-gate (or collector) region of the n-channel HFET. Such back-gate (or collector) regions are analogous to the substrate region of a MOSFET device as is well known. Therefore a non-inverted n-channel HFET device is stacked above an inverted p-channel HFET device as part of the active device structure.

A number of additional p-type layers can be formed above the gate region (layer(s) 121) of the n-channel HFET. Such additional p-type layer(s) can include one or more lightly doped p-type layers 123 followed by one or more heavily doped p-type layers 125. The lightly doped p-type layer 123 has p-type doping of a concentration in the range between $5e16$ $cm^{-3}$ and $5e17$ $cm^{-3}$ (with an exemplary target of $1e17$ $cm^{-3}$). The lightly doped p-type layer(s) 123 provide for isolation between the top p-type ohmic contact region and the layers there below. The lightly doped p-type layer(s) 123 also enable the use of ion implantation to provide guiding of current into the active region of the VCSEL and other optoelectronic devices. The heavily doped p-type layer 125 has p-type doping of a concentration of at least $7e18$ $cm^{-3}$, which causes an increase in electrical conduction such that the layer(s) 125 has metallic like characteristics. The heavily doped p-type layer(s) 125 provides a top p-type ohmic contact region for terminals (e.g., anode terminals) of optoelectronic devices.

One or more undoped spaced layers 127 can be formed on the heavily doped p-type layer(s) 125 as shown. To form a resonant cavity device for optical signal emission and/or detection, top mirror layers 129 can be formed over the active device structure described above. The top mirror layers 129 can be formed by depositing pairs of semiconductor or dielectric materials with different refractive indices. The one or more undoped spaced layers 127 can provide for adjustment of the vertical cavity dimensions for the resonant cavity devices, to form an aperture for optical devices (such as VCSELs) as described herein, and to form active and passive in-plane optical waveguide structures for optical devices.

The bottom n-type layers 105, 107, 109 and the inverted p-type modulation doped QW structure 113 and the non-inverted n-type modulation doped QW structure 117 and the top p-type layers 121, 123, 125 define a vertical thyristor (N-P-N-P) device structure. The bottom n-type layers 105, 107, 109 form the bottom n-type region of the vertical thyristor (N-P-N-P) device structure. The inverted p-type modulation doped QW structure 113 forms the intermediate p-type region of the vertical thyristor (N-P-N-P) device structure. The non-inverted n-type modulation doped QW structure 117 forms the intermediate n-type region of the vertical thyristor (N-P-N-P) device structure. The top p-type layers 121, 123, 125 form the top p-type region of the vertical thyristor (N-P-N-P) device structure. The vertical thyristor (N-P-N-P) device structure can be used to define an optical thyristor device or electrical thyristor device as needed.

To fabricate the n-channel HFET device, electrical contact is made to the gate region (layer(s) 121) of the n-channel HFET device by etching down to expose portions of one of the layers (such as p-type layer 123) above the gate region and implanting p-type ions into the exposed layer to form a p-type ion implant region that extends vertically downward from the exposed layer into and through the gate region. A p-type metal can be deposited and patterned on the p-type ion implant region. This resultant patterned p-type metal forms the gate electrode of the n-channel HFET device. If desired, electrical contact can be made to the back-gate region (the inverted p-type modulation doped QW structure 113 and the undoped spacer layer(s) 115) of the n-channel HFET device by etching down to expose a portion of layer 115 and implanting p-type ions into the exposed layer 115 to form a p-type ion implant region that extends vertically downward from the exposed layer 115 into and through the back-gate region. A p-type metal can be deposited and patterned on the p-type ion implant region. This resultant patterned p-type metal forms the back-gate electrode of the n-channel HFET device. A source terminal electrode and a drain terminal electrode of the n-channel HFET device are electrically coupled via n-type ion implanted contact regions to opposite ends of a QW channel(s) realized in the n-type modulation doped QW structure 117. Etch operations can etch down and expose portions of layer 119, which facilitates implant operations of n-type ions into the exposed layer 119 to form the n-type ion implanted contact regions as well as forming electrical contact between the source and drain terminal electrodes and the opposite ends of a QW channel(s) realized in the n-type modulation doped QW structure 117 for the n-channel HFET device.

To fabricate the p-channel HFET device, electrical contact is made to the gate region (layer(s) 109) of the p-channel HFET device by etching down to expose portions of layer 111 and implanting n-type ions into the exposed layer 111 to form an n-type ion implant region that extends vertically downward from the exposed layer 111 into and through the gate region (layer(s) 109). An n-type metal can be deposited and patterned on the n-type ion implant region. This resultant patterned n-type metal forms the gate electrode of the p-channel HFET device. If desired, electrical contact can be made to the back-gate region (the non-inverted n-type modulation doped QW structure 117 and the undoped spacer layer(s) 115) of the p-channel HFET device by etching down to expose a portion of layer 119 and implanting n-type ions into the exposed layer 119 to form an n-type ion implant region that extends vertically downward from the exposed layer 119 into and through the back-gate region (including the non-inverted n-type modulation doped QW structure 117). An n-type metal can be deposited and patterned on the n-type ion implant region. This resultant patterned n-type metal forms the back-gate electrode of the p-channel HFET device. A source terminal electrode and a drain terminal electrode of the p-channel HFET device are electrically coupled via p-type ion implanted contact regions to opposite ends of a QW channel(s) realized in the p-type modulation doped QW structure 113. Etch operations can etch down and expose portions of layer 115, which facilitates implant operations of p-type ions into the exposed layer 115 to form the p-type ion implanted contact regions as well as forming electrical contact between the source and drain terminal electrodes and the opposite ends of a QW channel(s) realized in the p-type modulation doped QW structure 113 for the p-channel HFET device.

Both the n-channel HFET device and the p-channel HFET device are field effect transistors where current flows as a two-dimensional gas through a QW channel with contacts at either end. The basic transistor action is the modulation of the QW channel conductance by a modulated electric field that is perpendicular to the QW channel. The modulated electric field modulates the QW channel conductance by controlling an inversion layer (i.e., a two-dimensional electron gas for the n-channel HFET device or a two-dimensional hole gas for the p-channel HFET) as a function of gate voltage relative to source voltage.

For the n-channel HFET device, the QW channel conductance is turned on by biasing the gate terminal electrode and the source terminal electrode at voltages where the P/N junction of the gate and source regions is forward biased with minimal gate conduction and an inversion layer of electron gas is created in the QW channel of the n-type modulation doped QW structure 117 between the source terminal electrode and the drain terminal electrode. In this configuration, the source terminal electrode is the terminal electrode from which the electron carriers enter the QW channel of the n-type modulation doped QW structure 117, the drain terminal electrode is the terminal electrode where the electron carriers leave the device, and the gate terminal electrode is the control terminal for the device.

The p-channel HFET device operates in a similar manner to the n-channel HFET device with the current direction and voltage polarities reversed with respect to those of the n-channel HFET device. For the p-channel HFET device, the QW channel conductance is turned on by biasing the gate terminal electrode and the source terminal electrode at a voltage where the P/N junction of the source and gate regions is forward-biased with minimal gate conduction and an inversion layer of hole gas is created in the QW channel of the p-type modulation doped QW structure 113 between the source terminal electrode and the drain terminal electrode. In this configuration, the source terminal electrode is the terminal from which the hole carriers enter the QW channel of the p-type modulation doped QW structure 113, the drain terminal electrode is the terminal where the hole carriers leave the device, and the gate terminal electrode is the control terminal for the device.

The n-channel HFET can also be configured to operate as a phototransistor where current flows as a two-dimensional gas through the QW channel region of the n-type modulation doped QW structure 117 of the active waveguide region with the source and drain terminal electrodes on either side of the QW channel region. The basic transistor action is the modulation of the QW channel conductance by an inversion layer (i.e., a two-dimensional electron gas) that is produced by the absorption of the optical mode propagating within the active waveguide region of the phototransistor. In this case, the gate terminal electrode can be omitted. Specifically, the QW channel conductance is controlled by the absorption of the optical mode propagating within the active waveguide region of the phototransistor, which produces an inversion layer of electron gas in the QW channel of the n-type modulation doped quantum well structure 117 between the source terminal electrode and the drain terminal electrode. This inversion layer provides a source-drain current path that allows for the conduction of current between the source terminal electrode and the drain terminal electrode. In other words, the source-drain current path of the phototransistor device is in its conducting ON state. Without the presence of the inversion, there is no source-drain current path that allows for the conduction of current between the source terminal electrode and the drain terminal electrode. In other words, the source-drain current path of the phototransistor is in its non-conducting OFF state. In this configuration, the source terminal electrode is the terminal electrode from which the electron carriers enter the QW channel of the n-type modulation doped QW structure 117, and the drain terminal electrode is the terminal electrode where the electron carriers leave the device.

The p-channel HFET can also be configured to operate as a phototransistor where current flows as a two-dimensional gas through the QW channel region of the p-type modulation doped QW structure 113 of the active waveguide region with the source and drain terminal electrodes on either side of the QW channel region. The basic transistor action is the modulation of the QW channel conductance by an inversion layer (i.e., a two-dimensional hole gas) that is produced by the absorption of the optical mode propagating within the active waveguide region of the phototransistor. In this case, the gate terminal electrode can be omitted. Specifically, the QW channel conductance is controlled by the absorption of the optical mode propagating within the active waveguide region of the phototransistor, which produces an inversion layer of hole gas in the QW channel of the p-type modulation doped quantum well structure 32 between the source terminal electrode and the drain terminal electrode. This inversion layer provides a source-drain current path that allows for the conduction of current between the source terminal electrode and the drain terminal electrode. In other words, the source-drain current path of the phototransistor device is in its conducting ON state. Without the presence of the inversion, there is no source-drain current path that allows for the conduction of current between the source terminal electrode and the drain terminal electrode. In other words, the source-drain current path of the phototransistor is in its non-conducting OFF state. In this configuration, the source terminal electrode is the terminal electrode from which the hole carriers enter the QW channel of the p-type modulation doped QW structure 22, and the drain terminal electrode is the terminal electrode where the hole carriers leave the device.

Figure 2A:
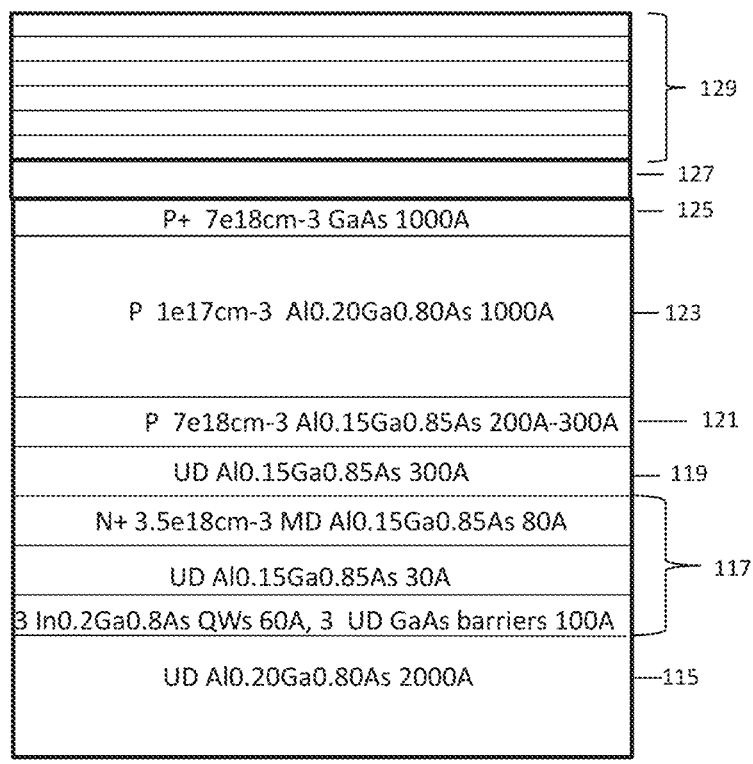
FIGS. 2A and 2B, collectively, is a chart illustrating an exemplary epitaxial semiconductor layer structure for realizing the integrated circuit device structures described herein.
Figure 2B:
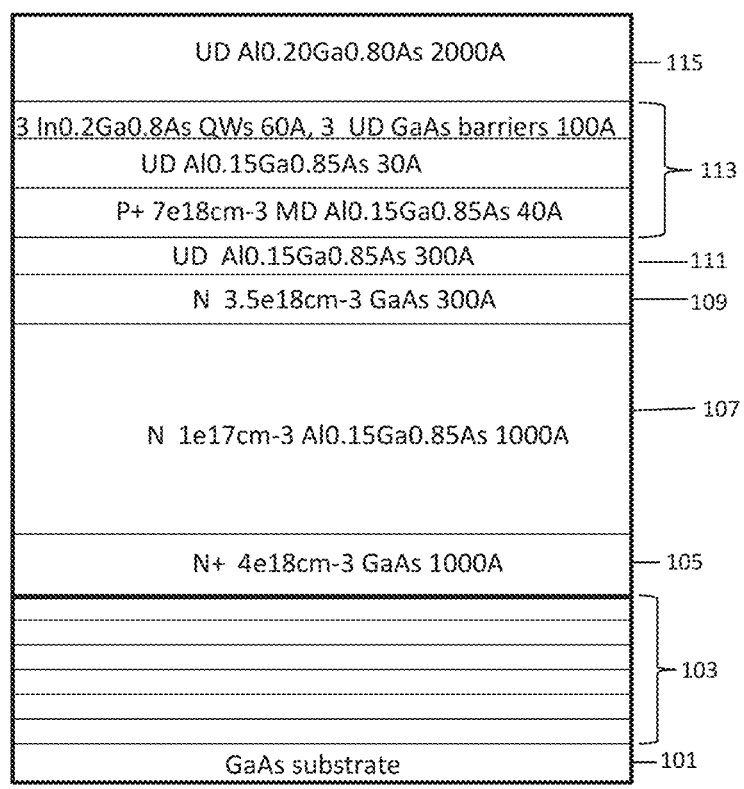

FIGS. 2A-B, collectively, is a chart illustrating an exemplary layer structure utilizing gallium arsenide group III-V materials for realizing the epitaxial layer structure of FIG. 1 as described herein. In other embodiments, other III-V materials such as indium phosphide materials, can be used for realizing the epitaxial layer structure of FIG. 1. The epitaxial layer structure of FIGS. 2A-B can be made, for example, using molecular beam epitaxy (MBE) techniques, chemical vapor deposition techniques or other suitable techniques. Starting from FIG. 2B, a semiconductor layer of aluminum arsenide (AlAs) and a semiconductor layer of gallium arsenide (GaAs) can be alternately deposited (with preferably at least seven pairs) upon a semi-insulating GaAs substrate 101 in sequence to form the bottom mirror layers 103. The number of AlAs layers will preferably always be one greater than the number of GaAs layers so that the first and last layers of the mirror are AlAs. In embodiments, the AlAs layers can be subjected to high temperature steam oxidation during fabrication to produce the compound $Al_xO_y$, so that a mirror will be formed at the designed center wavelength. This center wavelength is selected such that all of the desired resonant wavelengths for the device structures will be subject to high reflectivity. In one embodiment, the thicknesses of the AlAs and GaAs layers in the bottom mirror layers 103 can be chosen so that the final optical thickness of GaAs and $Al_xO_y$ are one quarter wavelength of the center wavelength kc. Alternatively the mirrors could be grown as alternating layers of one-quarter wavelength thickness of GaAs and AlAs at the designed wavelength so that the oxidation step is not used. In that case, many more pairs are required (with typical numbers such as 27.5 pairs at 980 nm or 29.5 pairs at 850 nm) to achieve the reflectivity needed for efficient optical lasing and detection.

Deposited on the bottom mirror layers 103 is the active device structure which begins with layer 105 of N+ GaAs material that enables the formation of ohmic contacts thereto. Layer 105 has a typical n-type doping of $4\times10^{18}$ cm$^{-3}$ and a typical thickness near 1000 Å. The N+ GaAs layer 105 corresponds to the heavily doped n-type layer 105 of FIG. 1 as described above.

Deposited on layer 105 is layer 107 of an N-type alloy of AlGaAs. In embodiments, layer 107 can be an alloy of $Al_{x1}Ga_{(1-x1)}As$, where the parameter x1 is preferably 15%, with a typical n-type doping of $1\times10^{17}$ cm$^{-3}$ and a typical thickness of 1000 Å. The N-type AlGaAs layer 107 can provide lower waveguide cladding and optical confinement. It can also enable low Source-Gate capacitance and low Drain-Gate capacitance for the p-channel HFET devices and low emitter-base capacitance for the N-N BICFERT devices. The N-type AlGaAs layer 107 corresponds to the lightly doped n-type layer 107 of FIG. 1 as described above.

Deposited on layer 107 is layer 109 of N+ GaAs material. In embodiments, the N+ GaAs layer can have a typical n-type doping of $3.5\times10^{18}$ cm$^{-3}$ and a typical thickness of 300 Å. The N+ GaAs layer 109 can function electrically as part of the gate region of the p-channel HFET device and forms the bottom plate of a capacitor that defines the input capacitance of the gate region of the p-channel HFET device. Layer 109 can incorporate sufficient n-type doping to limit the penetration of the capacitor spacer layer 111 by depletion into layer 109. The N+ GaAs layer 109 corresponds to the heavily doped n-type layer 109 of FIG. 1 as described above.

Next, an undoped spacer layer 111 formed from an alloy of AlGaAs is deposited on the N+ GaAs layer 109. In embodiments, the spacer layer 111 is formed from an alloy of $Al_{x1}Ga_{(1-x1)}As$, where the parameter x1 is preferably 15%, and has a typical thickness of 300 Å. Spacer layer 111 forms the spacer layer between the bottom plate (layer 109) and top plate (P+ charge sheet of inverted p-type modulation doped QW structure 113) of the capacitor that defines the input capacitance of the gate region of the p-channel HFET. The undoped AlGaAs spacer layer 111 corresponds to the undoped capacitor layer 111 of FIG. 1 as described above.

Next, an inverted p-type modulation doped quantum well structure 113 is formed on the spacer layer 121. The inverted p-type modulation doped quantum well structure 113 includes a thin p-type charge sheet formed from an alloy of AlGaAs. In embodiments, the p-type charge sheet can be formed from $Al_{x1}Ga_{(1-x1)}As$, where the parameter x1 is preferably 15%. The p-type charge sheet is doped P+ with a typical p-type doping of $7\times10^{18}$ cm$^{-3}$ and has atypical thickness of 40 Å. The p-type charge sheet forms the top plate of the capacitor that defines the input capacitance of the gate region of the p-channel HFET. The p-type charge sheet also functions as the p-type modulation doped layer for the inverted p-type modulation doped quantum well structure 113. Next is a undoped spacer layer formed from an alloy of AlGaAs. In embodiments, the undoped spacer layer is formed from $Al_{x1}Ga_{(1-x1)}As$, where the parameter x1 is preferably 15%, and has a typical thickness of 30 Å or less. Next, an InGaAs QW layer and undoped GaAs barrier layer are repeated for a number of quantum wells (such as three or more quantum wells). Single quantum well structures may also be used. In embodiments, the InGaAs QW layer can be formed from an alloy of $In_{x1}Ga_{(1-x1)}As$, where the parameter x1 is preferably 20%, and has a typical thickness of 60 Å. In embodiments, the undoped GaAs barrier layer has a typical thickness of 100 Å. These layers correspond to the inverted p-type modulation doped quantum well structure 113 of FIG. 1 as described above. In other embodiments, the QW layer of the inverted p-type modulation doped QW structure 113 can be formed from an alloy of InGaSb or an alloy of InGaAsSb in order to take advantage of the superior hole mobility of Sb (antimonides). For example, the QW layer can be alloy $In_{x1}Ga_{(1-x1)}Sb$ or $In_{x1}Ga_{(1-x1)}As_{y1}Sb_{(1-y1)}$. The parameter x1 of the alloy can be 50% and thickness down to 20A to access improved mobility at very high compressive stress.

Next, an undoped spacer layer 115 of an alloy of AlGaAs is formed on the last undoped GaAs barrier layer of the inverted p-type modulation doped quantum well structure 113. In embodiments, the undoped spacer layer 115 is formed from an alloy of $Al_{x1}Ga_{(1-x1)}As$, where the parameter x1 is preferably 20%, and has a typical thickness of 2000 Å. Spacer layer 115 is shown on both FIGS. 2A and 2B to illustrate the continuity of the epitaxial layer structure. Spacer layer 115 corresponds to the undoped spacer layer(s) 115 of FIG. 1 as described above.

Next, a non-inverted n-type modulation doped quantum well structure 117 is formed on the undoped spacer layer 115. The non-inverted n-type modulation doped quantum well structure 117 includes an undoped InGaAs QW layer and GaAs barrier layer that are repeated for a number of quantum wells (such as three or more quantum wells). Single quantum well structures may also be used. In embodiments, the undoped InGaAs QW layer is formed from an alloy of $In_{x1}Ga_{(1-x1)}As$, where the parameter x1 is preferably 20%, and has a typical thickness of 60 Å. In embodiments, the GaAs barrier layer has a typical thickness of 100 Å. Next is an undoped spacer layer formed from an alloy of AlGaAs. In embodiments, the undoped spacer layer is formed from an alloy of $Al_{x1}Ga_{(1-x1)}As$, where the parameter x1 is preferably 15%, and a typical thickness of 30 Å (or less in scaled structures). Next is a thin n-type charge sheet. In embodiments, the n-type charge sheet is formed from an alloy of $Al_{x1}Ga_{(1-x1)}As$, where the parameters x1 is preferably 15%. The n-type charge sheet is doped N+ with a typical n-type doping of $3.5\times10^{18}$ cm$^{-3}$ and has a typical thickness of 80 Å. The n-type charge sheet functions as the n-type modulation doped layer for the n-type modulation doped quantum well structure 117. The n-type charge sheet also forms the bottom plate of the capacitor that defines the input capacitance of the gate region of the n-channel HFET. These layers correspond to the n-type modulation doped QW structure 117 of FIG. 1 as described above. In other embodiments, the QW layer(s) of the non-inverted n-type modulation doped QW structure 117 can be formed using metamorphic growth techniques to reduce the QW bandgap and shift the wavelength to the 1500 nm range. In that case, the concentration of Indium the QW layer(s) can be greater than 60%.

Next, an undoped spacer layer 119 formed from an alloy of AlGaAs is deposited on the n-type charge sheet of the n-type modulation doped quantum well structure 117. In embodiments, the undoped spacer layer 119 can be formed from $Al_{x1}Ga_{(1-x1)}As$, where the parameters x1 are preferably 15%, and has a typical thickness of 300 Å. Spacer layer 119 forms the spacer layer between the bottom plate (n-type charge sheet) and top plate (layer 121) of the capacitor that defines the input capacitance of the gate region of the n-channel HFET. The undoped AlGaAs layer 119 corresponds to the spacer layer(s) 119 of FIG. 1 as described above.

Next, a layer 121 formed from an alloy of AlGaAs with p-type doping is deposited on the undoped AlGaAs layer 119. In embodiments, layer 121 is formed from $Al_{x1}Ga_{(1-x1)}As$, where the parameters x1 is preferably 15%. Layer 121 is P+ doped with a typical p-type doping of $7\times10^{18}$ cm$^{-3}$ and has a typical thickness of 200-300 Å. Layer 121 can function electrically as part of the gate region of the n-channel HFET device and forms the top plate of the capacitor that defines the input capacitance of the gate region of the n-channel HFET device. Layer 121 can incorporate sufficient p-type doping to limit the penetration of the capacitor spacer layer 119 by depletion into layer 121. Layer 121 corresponds to the heavily doped p-type layer(s) 121 of FIG. 1 as described above.

Next, layer 123 formed from an alloy of AlGaAs with p-type doping is deposited on the p-type AlGaAs layer 121. In embodiments, layer 123 is formed from an alloy of $Al_{x1}Ga_{(1-x1)}As$, where the parameter x1 is preferably 20%. Layer 123 is P doped with a typical p-type doping of $1\times10^{17}$ cm$^{-3}$ and has a typical thickness of 1000 Å. The p-type AlGaAs material of layer 123 can provide upper waveguide cladding and optical confinement and enable current steering implants for vcsel devices. Layer 123 corresponds to the lightly doped p-type layer(s) 123 of FIG. 1 as described above.

Next, a layer 125 of P+ GaAs material is deposited on the p-type AlGaAs layer 121. The P+ doped GaAs layer 125 enables the formation of ohmic contacts thereto. Layer 125 has a typical p-type doping of $7\times10^{18}$ cm$^{-3}$ and a typical thickness of 1000 Å. The P+ doped GaAs layer 125 corresponds to the heavily doped p-type layer(s) 125 of FIG. 1 as described above.

Next, a layer 127 of undoped GaAs is deposited on the P+ doped GaAs layer 125. Layer 127 can have a typical thickness of 250 Å or more. Layer 127 can be used for resonant cavity adjustment, to form an aperture for optical devices (such as VCSELs) as described herein, and to form active and passive in-plane optical waveguide structures for optical devices. Layer 127 corresponds to the undoped layer(s) 127 of FIG. 1 as described above.

To form a resonant cavity device for optical signal emission and/or detection, top mirror layers 129 can be formed over the active device structure described above. The top mirror layers 129 can be formed by depositing pairs of semiconductor or dielectric materials with different refractive indices.

Figure 3A:
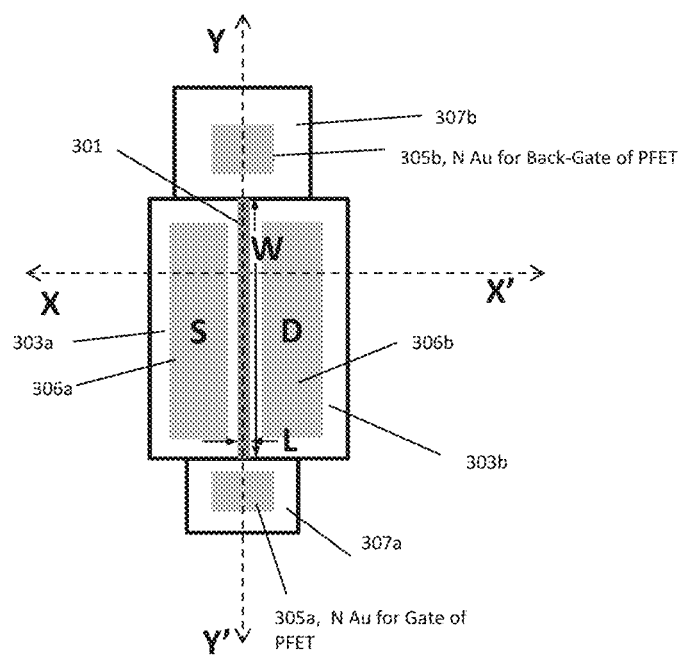
FIG. 3A is schematic top view of an exemplary p-channel HFET device according to the present disclosure.
Figure 3B:
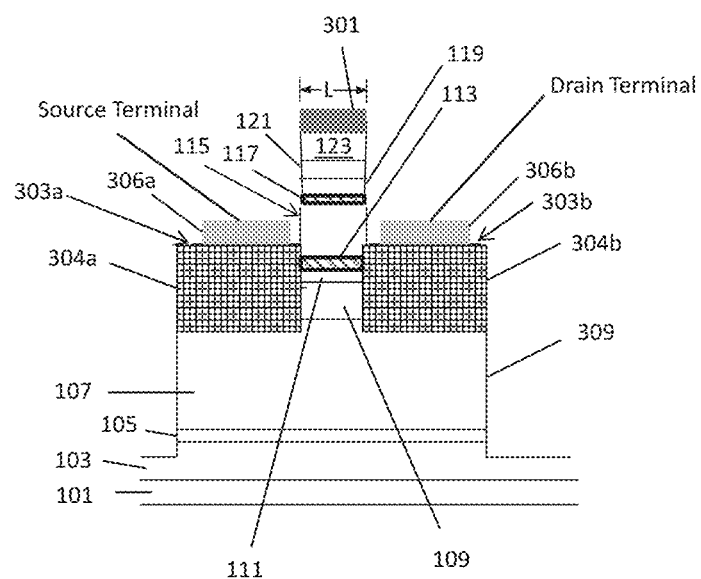
FIG. 3B is schematic cross-section view of the exemplary p-channel HFET device of FIG. 3A along the section labeled X-X' in FIG. 3A.
Figure 3C:
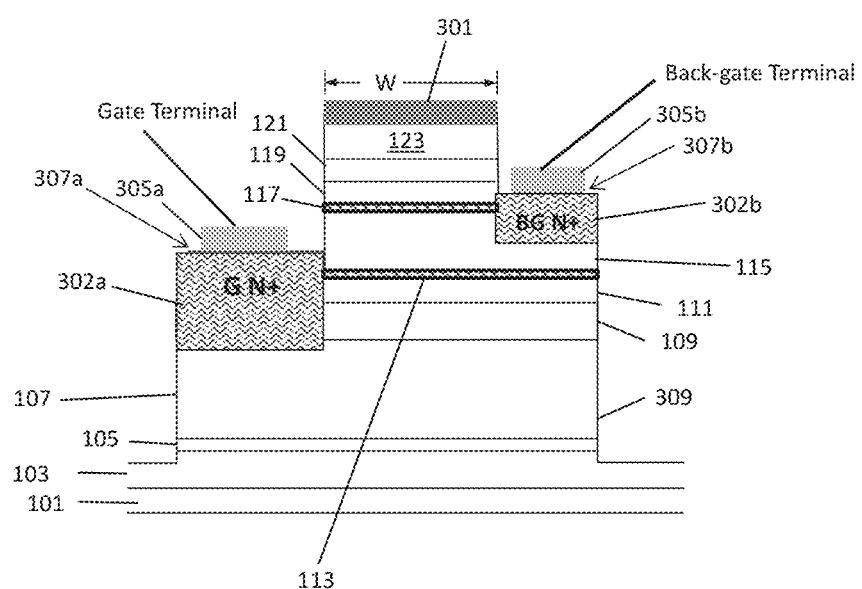
FIG. 3C is schematic cross-section view of the exemplary p-channel HFET device of FIG. 3A along the section labeled Y-Y' in FIG. 3A.

FIGS. 3A-3C illustrate an exemplary p-channel HFET device (or PHFET device) realized from the epitaxial layer structures of FIG. 1 and/or FIGS. 2A and 2B. As best shown in FIGS. 3A and 3B, a source terminal electrode 306a and a drain terminal electrode 306b are electrically coupled to the p-type modulation doped QW structure 113 via corresponding source and drain p-type ion implant regions 304a, 304b such that p-type modulation doped QW structure 113 forms a channel region between the source and drain p-type ion implant regions 304a, 304b (and the source terminal electrode 306a and the drain terminal electrode 306b electrically connected thereto). A feature 301, which can be formed from a refractory metal (such as tungsten) or other suitable material, is patterned on a mesa formed by etching into layer 123 (FIGS. 3A, 3B, 3C). The feature 301 overlies the channel region of the p-channel HFET. An etch is performed into layer 115 about 200 Å above the p-type modulation doped QW structure 113. The etch exposes portions of layer 115 (referred to as source and drain contact regions) that extend along opposite sides of the feature 301 and that are subject to implantation of p-type ions (e.g., Be/F ions) into the exposed portions of layer 115 to form the source and drain p-type ion implant regions 304a, 304b that extend along opposite sides of the feature 301 as best shown in FIG. 3B. The length (L) dimension of the feature 301 contributes to the effective length of the channel region between the source and drain p-type ion implant regions 304a, 304b. Another etch is performed that exposes a portion of layer 111 (referred to as a gate contact region) on one end of the feature 301 that is subject to implantation of n-type ions (e.g., Si/F ions) into the exposed layer 111 to form a gate n-type ion implant region 302a that extends vertically downward from the exposed layer 111 into and through the gate region (layer(s) 109) of the p-channel HFET device at one end of the feature 301 as best shown in FIG. 3C. The feature 301 can be used to define the channel length and to provide a self-aligning implant mask along the sides of the feature for the source and drain ion implants and at the end of the feature for the gate ion implant. Another etch is performed (starting from the tungsten level in layer 123) into layer 119 about 300 Å above the n-type modulation doped QW structure 117. This etch exposes a portion of layer 119 (referred to as a back-gate contact region) at the other end of the feature 301, which is opposite the gate contact region and the area of the gate n-type ion implant region 302a. The exposed portion of layer 119 is subject to implantation of n-type ions (e.g., Si/F ions) into the exposed layer 119 to form a back-gate n-type ion implant region 302b that extends vertically downward from the exposed layer 119 into and through the back-gate region (including the non-inverted n-type modulation doped QW structure 117) of the n-channel HFET device at the other end of the feature 301 as best shown in FIG. 3C. The feature 301 can be used to provide a self-aligning implant mask at the other end of the feature for the back-gate ion implant. The width (W) dimension of feature 301 contributes to the effective width of the channel region between the gate and back-gate n-type ion implant regions 302a, 302b. In this configuration, the width (W) dimension and corresponding effective width of the channel region of the p-channel HFET device is much greater than the length (L) dimension (for typical applications) and corresponding effective length of the channel region of the p-channel HFET device, and the gate and back-gate n-type ion implant regions 302a, 302b are disposed on opposite ends of the width (W) dimension of the feature 301 and the corresponding effective width of the channel region of the p-channel HFET device. An etch 309 down to the bottom mirror layers 103 can form mesas 303a, 303b that incorporate the p-type ion implant regions 304a, 304b as best shown in FIGS. 3A and 3B. The etch 309 down to the bottom mirror layers 103 can also form a mesa 307a that incorporates the gate n-type ion implant region 302a as best shown in FIGS. 3A and 3C. The same or similar etch down to the bottom mirror layers 103 can also form a mesa 307b that incorporates the back-gate n-type ion implant region 302b as best shown in FIGS. 3A and 3C. The source and drain p-type ion implant regions 304a, 304b as well as the gate and back-gate n-type ion implant regions 302a, 302b become amorphous structures due to ion bombardment. Rapid thermal anneal (RTA) operations can be performed to anneal the source and drain p-type ion implant regions 304a, 304b as well as the gate and back-gate n-type ion implant regions 302a, 302b before metallization. The thermal energy of the RTA operations can transform the amorphous structure back to the single crystal structure and allow the dopant atoms to form bonds on the semiconductor layers as donors (for n-type) or acceptors (for p-type). A p-type metal (such as p-type gold) can be deposited and patterned on the mesas 303a, 303b in contact with the corresponding source and drain p-type ion implant regions 304a, 304b to form the source and drain terminal electrodes 306a, 306b as shown in FIGS. 3A and 3B. An n-type metal (such as n-type gold) can be deposited and patterned on the mesas 307a, 307b in contact with the corresponding gate and back-gate n-type ion implant regions 302a, 302b to form the gate and back-gate terminal electrodes 305a, 305b as shown in FIGS. 3A and 3C. FIGS. 3A-3C illustrate the following features of the PHFET device:

i) 301—Tungsten feature patterned on mesa formed by etch to layer 123 (FIGS. 3A, 3B, 3C); the feature overlies the channel of the PFET and is used to etch into layer 115 about 400A above the p-type mod doped QW structure 113;

ii) 302a, 302b—N+ Ion implant regions for Gate and Back-Gate of PFET (FIG. 3C);

iii) 303a, 303b—Mesas for S/D of PFET at layer 115 (FIGS. 3A, 3B);

iv) 304a, 304b—P+ Ion implant regions for Source (S)/Drain(D) Terminals (FIG. 3B);

v) 305a, 395b—N Au for Gate and Back-Gate Terminals (FIGS. 3A, 3C);

vi) 306a, 306b—P Au for Source(S)/Drain(D) Terminals (FIGS. 3A, 3B);

vii) 307a, 307b—Mesa for Gate of PFET at layer 115, and Mesa for Back-Gate of PFET at layer 119 (FIGS. 3A, 3C); and viii) 309—Etch to bottom mirror layers 103 (FIGS. 3B, 3C).

The p-channel HFET device is an enhancement-mode device with a negative voltage level of VGS turning-on the device. Under normal operation, the source terminal electrode 306a is forward biased with respect to the drain terminal electrode 306b by a positive voltage level $V_{SD}$, and the gate terminal electrode 305a is reverse biased with respect to the source terminal electrode 306a by a negative voltage level VGS. For small values of $V_{SD}$, the device can operate in the triode region where the drain current ID varies in a quasi-linear manner with respect to $V_{SD}$. For larger values of $V_{SD}$, the device operates in the constant current region where the drain current ID is substantially constant with respect to $V_{SD}$. The back-gate terminal electrode 305b of the device can provide for bias control of the region above the p-type QW inversion channel(s) of the structure 113. More specifically, a positive bias on the back-gate terminal electrode 305b with respect to the source terminal electrode 306a causes a decrease in the turn-on (i.e., an increase in the negative threshold) voltage of the p-channel HFET device. This bias voltage also increases the diode depletion region width, thereby decreasing the parasitic node capacitance.

Figure 3D:
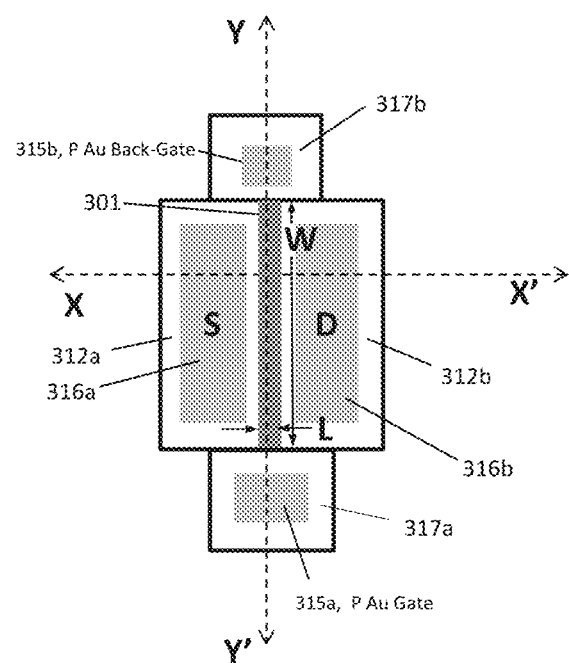
FIG. 3D is schematic top view of an exemplary n-channel HFET device according to the present disclosure.
Figure 3E:
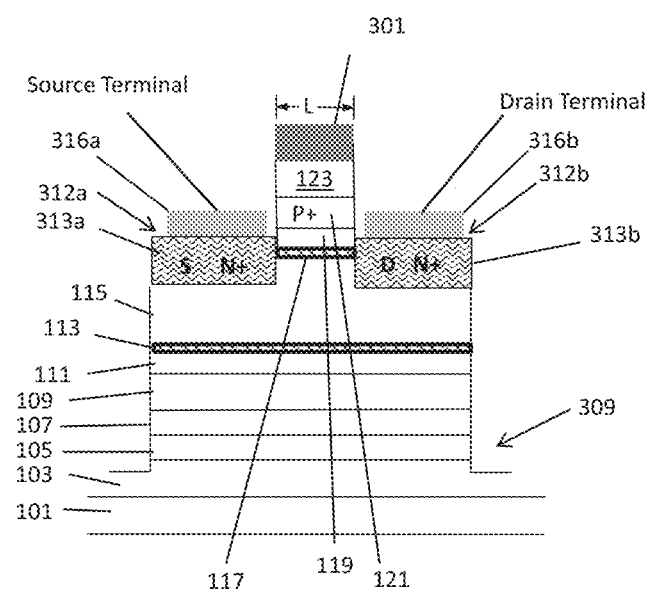
FIG. 3E is schematic cross-section view of the exemplary n-channel HFET device of FIG. 3D along the section labeled X-X' in FIG. 3D.
Figure 3F:
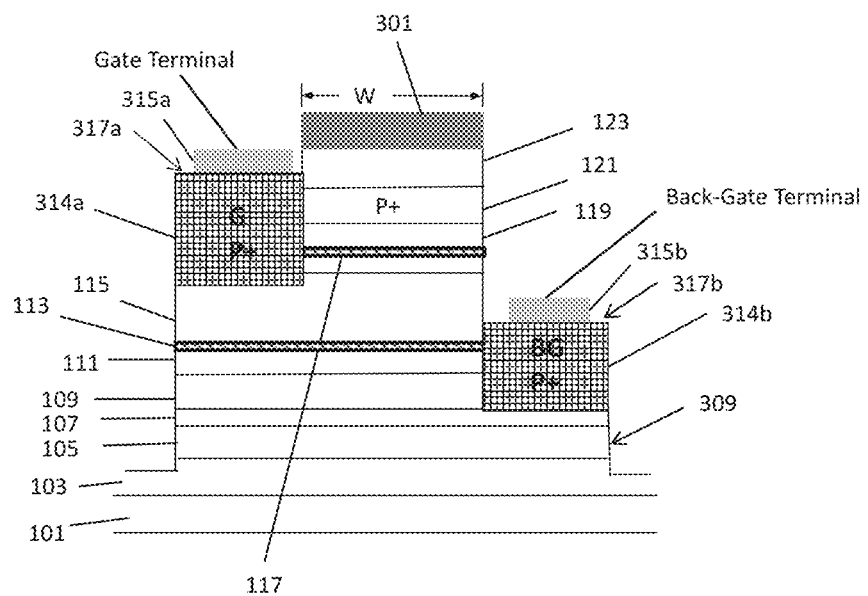
FIG. 3F is schematic cross-section view of the exemplary n-channel HFET device of FIG. 3D along the section labeled Y-Y' in FIG. 3D.

FIGS. 3D-3F illustrate an exemplary n-channel HFET device (or NHFET device) realized from the epitaxial layer structures of FIG. 1 and/or FIGS. 2A and 2B. As shown, a source terminal electrode 312a and a drain terminal electrode 312b are electrically coupled to the n-type modulation doped QW structure 117 via corresponding source and drain n-type ion implant regions 313a, 313b such that the n-type modulation doped QW structure 117 forms a channel region between the source and drain n-type ion implant regions 313a, 313b (and the source terminal electrode 312a and the drain terminal electrode 312b electrically connected thereto). A feature 301, which can be formed from a refractory metal (such as tungsten) or other suitable material, is patterned on a mesa formed by etching into layer 123 (FIGS. 3D, 3E, 3F). The feature 301 overlies the channel region of the n-channel HFET. An etch is performed into layer 119 about 300 Å above the n-type modulation doped QW structure 117. It is noted that this etch is performed after the formation of the tungsten feature 301. After the patterning with a photoresist mask of the S and D contact regions of the NHFET at the tungsten level, i.e. the etched surface in 123, this pattern is used as an etch mask. Alternatively, this etch can be performed by first protecting the gate implant region (which will receive a p type implant) with a photoresist mask. The etch exposes portions of layer 119 (referred to as source and drain contact regions) that extend along opposite sides of the feature 301 and that are subject to implantation of n-type ions (e.g., Si/F ions) into the exposed layer 119 to form the source and drain n-type ion implant regions 313a, 313b that extend along opposite sides of the feature 301 as best shown in FIG. 3D. The feature 301 can be used to define the channel length and to provide a self-aligning implant mask along the sides of the feature for the source and drain ion implants. The length (L) dimension of feature 301 contributes to the effective length of the channel region between the source and drain n-type ion implant regions 313a, 313b. Another etch is performed into layer 123 about 200-400 Å above layer 121 (this etch can be the initial etch for the transistor fabrication that is used to establish the tungsten level for all electronic devices). This etch exposes a portion of layer 123 (referred to as a gate contact region) on one end of the feature 301 that is subject to implantation of p-type ions (e.g., Be/F ions) into the exposed layer 123 to form a gate p-type ion implant region 314a that extends vertically downward from the exposed layer 123 into and through the gate region (layer(s) 121, 119) of the n-channel HFET device at one end of the feature 301 as best shown in FIG. 3F. An etch can be performed into layer 115 about 300 Å above the p-type modulation doped QW structure 113. The etch exposes a portion of layer 115 (referred to a back-gate contact region) at the other end of the feature 301, which is opposite the area of the gate p-type ion implant region 314a. This exposed portion of layer 115 is subject to implantation of p-type ions (e.g., Be/F ions) into the exposed layer 115 to form a back-gate p-type ion implant region 314b that extends vertically downward from the exposed layer 115 into and through the back-gate region (including the inverted p-type modulation doped QW structure 113) of the n-channel HFET device at the other end of the feature 301 as best shown in FIG. 3F. The feature 301 can be used to provide a self-aligning implant mask at the other end of the feature for the back-gate ion implants. The width (W) dimension of feature 301 contributes to the effective width of the channel region between the gate and back-gate p-type ion implant regions 314a, 314b. In this configuration, the width (W) dimension and corresponding effective width of the channel region of the n-channel HFET device is much greater than the length (L) dimension and corresponding effective length of the channel region of the n-channel HFET device, and the gate and back-gate p-type ion implant regions 314a, 314b are disposed on opposite ends of the width (W) dimension of the feature 301 and the corresponding effective width of the channel region of the n-channel HFET device. An etch 309 down to the bottom mirror layers 103 can form mesas 312a, 312b that incorporate the source and drain n-type ion implant regions 313a, 313b as best shown in FIGS. 3D and 3E. The etch 309 down to the bottom mirror layers 103 can also form a mesa 317a that incorporates the gate p-type ion implant region 314a as best shown in FIGS. 3D and 3F. The same or similar etch down to the bottom mirror layers 103 can also form a mesa 317b that incorporates the back-gate p-type ion implant region 314b as best shown in FIGS. 3D and 3F. The source and drain n-type ion implant regions 313a, 313b as well as the gate and back-gate p-type ion implant regions 314a, 314b become amorphous structures due to ion bombardment. Rapid thermal anneal (RTA) operations can be performed to anneal the source and drain n-type ion implant regions 313a, 313b as well as the gate and back-gate p-type ion implant regions 314a, 314b before metallization. The thermal energy of the RTA operations can transform the amorphous structure back to the single crystal structure and allow the dopant atoms to form bonds on the semiconductor layers as donors (for n-type) or acceptors (for p-type). An n-type metal (such as n-type gold) can be deposited and patterned on the mesas 312a, 312b (in contact with the corresponding source and drain n-type ion implant regions 313a, 313b) to form the source and drain terminal electrodes 316a, 316b as shown in FIGS. 3D and 3E. A p-type metal (such as p-type gold) can be deposited and patterned on the mesas 317a, 317b (in contact with the corresponding gate and back-gate p-type ion implant regions 314a, 314b) to form the gate and back-gate terminal electrodes 315a, 315b as shown in FIGS. 3D and 3F. FIGS. 3D-3F illustrate the following features of the NHFET device:

i) 301 —Tungsten feature patterned on mesa formed by etch to layer 123 (FIGS. 3D, 3E, 3F); the feature overlies the channel of the NFET and is used to etch into layer 123 about 200A above layer 121;
ii) 312a, 312b—Mesas for S/D of NFET at layer 119 (FIGS. 3D, 3E);
iii) 313a, 313b—N+ Ion implant regions for Source(S)/Drain(D) Terminals (FIG. 3E);
iv) 314a, 314b—P+ Ion implant for Gate and Back-gate Terminals (FIG. 3F);
v) 315a, 315b—P Au for Gate and Back-gate Terminals (FIGS. 3D and 3F);
vi) 316a, 316b—N Au for Source(S)/Drain(D) Terminals (FIGS. 3D, 3E);
vii) 317a, 317b—Mesa for Gate of NFET in layer 123 just above 121, and Mesa for Back-Gate of NFET in layer 115 just above 113 (FIGS. 3D, 3F);
viii) 309—Etch to bottom mirror layers 103 (FIGS. 3E, 3F).

The n-channel HFET device is an enhancement-mode device with a positive voltage level of VGS turning-on the device. Under normal operation, the drain terminal electrode 316b is forward biased with respect to the source terminal electrode 316a by a positive voltage level VDS, and the gate terminal electrode 315a is forward biased with respect to the source terminal electrode 316a by a positive voltage level VGS. For small values of VDS, the device operates in the triode region where the drain current ID varies in a quasi-linear manner with respect to VDS. For larger values of VDS, the device operates in the constant current region where the drain current ID is substantially constant with respect to VDS. The back-gate electrode 315b of the device can provide for bias control of the region under the N-type QW inversion channel(s) of structure 117. More specifically, a negative bias on the back-gate electrode 315b with respect to the source terminal electrode 312a causes an increase in the turn-on voltage of the n-channel HFET device. This bias voltage also increases the diode depletion region width, thereby decreasing the parasitic node capacitance.

In the embodiments described above, p-type ion implants are used to contact to the gate region and/or back gate region of the N-channel HFET devices, and n-type ion implants are used to contact to the gate region and/or back gate region of the P-channel HFET devices. These implant operations can be effectively controlled and aid in minimizing gate resistance for high performance operation of the complementary HFET devices. Furthermore, the combination of the lightly doped n-type layer 107 and the p-type gate ion implant ensures that the Source-Gate and Drain-Gate capacitance of P-channel HFET devices will be low. Such low capacitance results from the penetration of the p-type gate ion implant region into through the gate layer 109, which forms a P-N junction whose bottom is in layer 107. This junction will be low capacitance (and thus minimize current leakage and capacitance) for high performance operation of the p-channel HFET devices.

The device structure of the present application can also be configured to realize other transistor devices (such as complementary bipolar inversion channel field-effect transistors), optoelectronic devices (such as VCSELs, in-plane lasers, electrically or optically-pump lasers, optical thyristors, laser arrays, detectors, modulators, and optical switches) and purely optical devices (such as passive waveguides and off-chip couplers).

In embodiments, fabrication steps can be used to form electrical devices (such as complementary n-channel and p-channel HFET devices and/or complementary P-P and N-N bipolar inversion channel field-effect transistors or BICFET devices) together with optoelectronic devices (such as VCSELs, in-plane lasers, electrically or optically-pumped lasers, optical thyristors, laser arrays, optical detectors, optical modulators, and optical switches) and possibly purely optical devices (such as passive waveguides and off-chip couplers) in an integrated circuit (IC) that employs an epitaxial layer structure as described herein and shown in FIGS. 1 and/or 2A-2B (before depositing the top mirror layers).

The fabrication steps begin in block 401 where alignment marks are defined on layer 127 of the semiconductor layer structure.

In block 402, a nitride layer (of approximately 500 Å in thickness) is deposited on layer 127 of the semiconductor layer structure.

In block 403, a photoresist mask is deposited and patterned on the nitride layer. The patterned photoresist mask functions as an etch mask that defines vertical laser apertures and the in-plane waveguide apertures. The apertures are protected by the patterned photoresist mask.

In block 404, an etch operation is performed using the photoresist mask of 403 through the nitride layer deposited in 402 and into the semiconductor layer structure down to the highly-doped p-type layer 125 to define the apertures. The apertures are formed by mesas of layer 127 and can function optically as waveguide regions and/or resonance cavities for certain optoelectronic or optical devices of the IC.

In block 405, oxygen ions and then n-type dopant ions (e.g., Si/F ions) are implanted using the photoresist mask of 403 into the semiconductor layer structure on opposite sides of the apertures for certain optical devices of the IC. The oxygen ions are implanted to a depth centered at or near the center of the intermediate spacer layer 115. The n-type dopant ions are implanted to a depth centered at or near the center of layer 123.

In block 406, the photoresist mask of 403 is removed.

In block 407, a photoresist mask is deposited and patterned to expose all areas in which electronic devices (e.g., NHFET devices, PHFET devices, P-P BICFET devices, N-N BICFET devices) will be formed. The apertures and the anode or top emitter contact regions for the optoelectronic devices and optical devices are protected by the photoresist mask In block 408, the photoresist mask of 407 is used to etch the semiconductor layer structure to expose all areas in which electronic devices (e.g., NHFET devices, PHFET devices, P-P BICFET devices, N-N BICFET devices) will be formed. The etch is controlled to terminate approximately 300-400 Å above layer 121. This etch depth can be designated as "d1" and it is designed for optical device isolation and for proximity to layer 121. In embodiments, the etch can employ dry etching techniques with a gas suitable for III-V compounds (e.g. BCl3).

In block 409, the photoresist mask of 407 is removed.

In optional block 410, a photoresist mask can be applied to expose certain n-channel devices (such as n-channel HFET devices) and then an ion implant is performed, which is confined to the region above the n-type modulation doped QW structure 117 in order to preserve the high channel mobility. The species of the ion implants can be n-type (such as Si/F ions in the range of $1e17\ cm^{-3}$ to $1e18\ cm^{-3}$) or p-type (such as Be/F ions in the range of $1e17\ cm^{-3}$ to $1e18\ cm^{-3}$). The doping type and concentration of the ion implant can be configured to shift or adjust the n-channel threshold as deemed appropriate, such as to correct for errors in the original epitaxy, enable compatibility of the optimum laser performance (threshold current) with the optimum threshold voltage for the n-channel HFET devices, and enable the implementation of multi-level logic design. In this configuration, implantation of n-type ions (such as Si/F ions) can shift the n-channel threshold down (i.e., negative or more depletion type). On the other hand, implantation of p-type ion (such as Be/F ions) can shift the n-channel threshold up (i.e., positive or more enhancement type). Then, the photoresist mask can be removed. Similarly, another photoresist mask can be applied to expose certain p-channel devices (such as p-channel HFET devices), and then an ion implant is performed, which is confined to the region at and below the n-type modulation doped QW structure 117 (i.e., into the back-gate region of the p-channel HFET devices). The species of the ion implants can be p-type (such as Be/F ions in the range of $1e17\ cm^{-3}$ to $1e18\ cm^{-3}$) or n-type (such as Si/F ions in the range of $1e17\ cm^{-3}$ to $1e18\ cm^{-3}$). The doping type and concentration of the ion implant can be configured to shift or adjust the p-channel threshold as deemed appropriate, such as to correct for errors in the original epitaxy, enable compatibility of the optimum laser performance (threshold current) with the optimum threshold voltage for the p-channel HFET devices, and enable the implementation of multi-level logic design. In this configuration, implantation of p-type ions (such as Be/F ions) can shift the p-channel threshold down (i.e., positive or more depletion type). On the other hand, implantation of n-type ions (such as Si/F ions) can shift the p-channel threshold up (i.e., negative or more enhancement type). Then, the photoresist mask can be removed.

In block 411, a refractory metal (e.g., tungsten) is deposited on layer 123 (which is exposed by the etch of 408) for the top features of the electronic devices. The refractory metal (e.g., tungsten) will also be deposited on layer 125 (which is exposed by the etch of 404) for the anode electrode or top emitter electrodes for certain optoelectronic devices (e.g., VCSELs, in-plane lasers, electrically or optically-pump lasers, optical thyristors, laser arrays, optical detectors, optical modulators, and optical switches).

In block 412, a photoresist mask is deposited and patterned to define the top features of the electronic devices. The refractory metal (e.g., tungsten) of 411 is etched using the photoresist mask to define the features of the electronic devices. The same or different photoresist mask can be used to etch the refractory metal (e.g., tungsten) to define the anode electrodes or top emitter electrodes for the optoelectronic devices. The refractory metal (e.g., tungsten) of 411 can be patterned by dry etching with sulfur hexafluoride (SF6).

In block 413, the photoresist mask of 412 is removed.

In block 414, a photoresist mask is deposited and patterned to protect all electronic devices, which is equivalent to exposing all optoelectronic devices and optical devices.

In block 415, the photoresist mask of 414 is used to etch the semiconductor layers, for example using BCl3, to the depth d1 as in 408 for all n-channel optoelectronic devices. After this etch, the n-channel devices (both electrical and optical) are expected to have a common depth level at or near the depth d1 in layer 123.

In block 416, the photoresist mask of 414 is removed.

In block 417, a photoresist mask is deposited and patterned on layer 123 at the d1 level to expose the source and drain contact regions of NHFET devices, the back-gate contact regions for PHFET devices, the base contact region for P-P BICFET devices, the collector contact region of N-N BICFET devices, and the n-channel contact region (also referred to as n-source or source contact region) of the optoelectronic devices (when used). Alternatively, a photoresist mask could be deposited and patterned on layer 123 at the d1 level to protect the areas at the end of the 301 feature that are designated the gate contact areas (designed to receive the p type implant) and leave all other areas exposed.

In block 418, the semiconductor layer structure is etched, for example using BCl3, using the patterned photoresist mask of 417 down to about the center of layer 119 to expose the source and drain contact regions of NHFET devices, the back-gate contact regions for PHFET devices, the base contact region for P-P BICFET devices, the collector contact region of N-N BICFET devices, and the n-channel contact region (also referred to as n-source or source contact region) of the optoelectronic devices (when used).

In block 419, the photoresist mask of 417 is removed.

In block 420, a nitride of about 500 Å is deposited, for example, by plasma-enhanced chemical vapor deposition (PECVD) to be conformal. Then, the nitride is subjected to an anisotropic etch to create dielectric sidewalls on all tungsten coated mesas. The purpose of the sidewalls is to prevent implant penetration into the semiconductor sidewalls and to maintain the effective length for submicron n-channel devices.

In block 421, n-type dopant ions (e.g., Si/F ions) are implanted. First, a source—drain photoresist mask (similar to the mask of 417) is deposited and patterned. Then, the n-type dopant ions (e.g., Si/F ions) are implanted into the source and drain contact regions of NHFET devices, the back-gate contact regions for PI-FET devices, the base contact region for P-P BICFET devices, the collector contact region of N-N BICFET devices, and the n-channel contact region (also referred to as n-source or source contact region) of the optoelectronic devices (when used). In embodiments, the n-type dopant concentration of the ion implants can be in the range of $5e^{18}$-$1e^{19}$ cm$^{-3}$.

In block 422, the photoresist mask of 421 is removed.

In block 423, a photoresist mask is deposited and patterned on layer 123 at the d1 level to expose the gate contact region of NHFET devices and the emitter contact region of P-P BICFET devices.

In block 424, p-type dopant ions (e.g., Be/F ions) are implanted using the photoresist mask of 423 into the gate contact region of NIFET devices and the emitter contact region of P-P BICFET devices. In embodiments, the p-type dopant concentration of the ion implants can be in the range of $1e^{19}$-$1.5e^{19}$ cm$^{-3}$.

In block 425, the photoresist mask of 423 is removed.

In block 426, a photoresist mask is deposited and patterned on layer 123 at the d1 level to expose the source and drain contact regions of PHFET devices, the p-channel contact region of the optoelectronic devices (when used), the gate contact region of PHFET devices, the back-gate contact region of NHFET devices, the base contact region of N-N BICFET devices, the emitter contact region of N-N BICFET devices, the collector contact region of P-P BICFET devices, the gate contact region of the PI-FET devices, the emitter contact region of the N-N BICFET devices, and the cathode contact region of the optoelectronic devices (when used).

In block 427, the semiconductor layer structure is etched, for example using BCl3, using the patterned photoresist mask of 426 into layer 115 to a level about 300 Å above layer 113.

In block 428, the photoresist mask of 426 is removed.

In block 429, a nitride of about 500 Å is deposited by PECVD (to be conformal) and is followed by an anisotropic etch of the nitride to create dielectric sidewalls on all tungsten coated mesas. The purpose of the sidewalls is to prevent implant penetration into the semiconductor sidewalls and into the QW channel, which reduces the effective length of the p-channel HFET devices.

In block 430, a photoresist mask is deposited and patterned at layer 115 (as exposed by the etch of 427) to expose the source and drain contact regions of PHFET devices, the p-channel contact region of the optoelectronic devices (when used), the gate contact region of PHFET devices, the back-gate contact region of NHFET devices, the base contact region of N-N BICFET devices, the emitter contact region of N-N BICFET devices, and the collector contact region of P-P BICFET devices.

In block 431, p-type dopant ions (e.g., Be/F ions) are implanted using the photoresist mask of 430 into the source and drain contact regions of PHFET devices, the p-channel contact region of the optoelectronic devices (when used), the gate contact region of PHFET devices, the back-gate contact region of NHFET devices, the base contact region of N-N BICFET devices, the emitter contact region of N-N BICFET devices, and the collector contact region of P-P BICFET devices. In embodiments, the p-type dopant concentration of the ion implants can be in the range of $1e^{19}$-$1.5e^{19}$ cm$^{-3}$.

In block 432, the photoresist mask of 430 is removed.

In block 433, a photoresist mask is deposited and patterned at layer 115 (as exposed by the etch of 427) to expose the gate contact region of PHFET devices and the emitter contact region of the N-N BICFET devices.

In block 434, the semiconductor layer structure is etched, for example using BCl3, using the patterned photoresist mask of 433 down to about the center of layer 111 to expose the gate contact region of PHFET devices and the emitter contact region of the N-N BICFET devices.

In block 435, n-type dopant ions (e.g., Si/F ions) are implanted using the photoresist mask of 434 into the gate contact region of the PHFET devices and the emitter contact region of the N-N BICFET devices. In embodiments, the n-type dopant concentration of the ion implants can be in the range of $5e^{18}$ to $1e^{19}$ cm$^{-3}$.

In block 436, the photoresist mask of 433 is removed.

In block 437, a photoresist mask is deposited and patterned at layer 115 (as exposed by the etch of 427) to expose the cathode contact region of the optoelectronic devices (when used).

In block 438, the semiconductor layer structure is etched, for example using BCl3, using the patterned photoresist mask of 437 down to layer 105 to expose the cathode contact region of the optoelectronic devices (when used).

In block 439, the photoresist mask of 437 is removed.

In block 440, silicon nitride is deposited with a typical thickness of 500 Å in preparation for rapid thermal anneal of all ion implanted regions.

In block 441, rapid thermal anneal (RTA) operations are performed. For example, the RTA operations can employ a typical cycle of 850° C. for 15 seconds with an inert background. The ion implant regions become amorphous structures due to ion bombardment. The RTA operations can be performed to anneal all ion implant regions before metallization. The thermal energy of the RTA operations can transform the amorphous structure back to the single crystal structure and allow the dopant atoms to form bonds on the semiconductor layers as donors (for n-type) or acceptors (for p-type).

In block 442, a photoresist mask is deposited and patterned for the formation of n-type Au electrodes via liftoff. The n-type Au electrodes can include gate and back-gate electrodes of PHFET devices (which are formed on the n-type ion implanted gate and back-gate contact regions of PHFET devices), source and drain electrodes of NIFET devices (which are formed on the n-type ion implanted source and drain contact regions of the NHFET devices), base electrodes of P-P BICFET devices (which are formed on the n-type ion implanted base contact regions of the P-P BICFET devices), collector and emitter electrodes of N-N BICFET devices (which are formed on the n-type ion implanted collector and emitter contact regions of the N-N BICFET devices), n-channel (or n-source) electrodes of optoelectronic devices (which are formed on the n-type ion implanted n-channel contact region(s) of the optoelectronic devices, when used), and cathode electrodes of the optoelectronic devices (which are formed in the n-type cathode contact region(s) (layer 105) of the optoelectronic devices, when used).

In block 443, n-type Au metal (e.g., alloy of AuGe—Ni—Au) is deposited for the n-type Au electrodes.

In block 444, the n-type Au electrodes are patterned via liftoff.

In block 445, a photoresist mask is deposited and patterned for the formation of p-type Au electrodes via liftoff. The p-type Au electrodes can include gate and back-gate electrodes of NHFET devices (which are formed on the p-type ion implanted gate and back-gate contact regions of NHFET devices), source and drain electrodes of PHFET devices (which are formed on the p-type ion implanted source and drain contact regions of PHFET devices), base electrodes of N-N BICFET devices (which are formed on the p-type ion implanted base contact regions of N-N BICFET devices), collector and emitter electrodes of P-P BICFET devices (which are formed on the p-type ion implanted collector and emitter contact regions of P-P BICFET devices), and p-channel (or p-source) electrodes of optoelectronic devices (which are formed on the p-type ion implanted p-channel contact region(s) of the optoelectronic devices, when used).

In block 446, p-type Au metal (e.g., alloy of AuBe—Cr—Au) is deposited for the p-type Au electrodes.

In block 447, the p-type Au electrodes are patterned via liftoff.

In block 448, the n-type Au electrodes and the p-type Au electrodes are sintered or annealed. For example, the sintering operations can employ a typical cycle of 420° C. for 15 seconds.

In block 449, a photoresist mask is deposited and patterned for all devices to etch a trench into the bottom mirror layers 103 (approximately 1000 Å) to isolate all devices.

In block 450, the photoresist mask of 449 is used to etch the semiconductor layer structure, for example using dry etching techniques (e.g., BCl3), into the bottom mirror layers 103.

In block 451, the photoresist mask of 449 is removed.

In block 452, an interlevel dielectric material, such as silicon nitride (SiN) or silicon oxide (SiO2), is deposited to enable metal interconnect crossovers as needed.

In block 453, a photoresist mask is deposited and patterned to etch contact holes for all metal interconnect connections.

In block 454, the photoresist mask of 453 is used to etch contact openings through the interlevel dielectric material. For example, CF4 and SF6 etchant can be used to etch SiN or SiO2 dielectric material.)

In block 455, the photoresist mask of 453 is removed.

In block 456, a photoresist mask is deposited and patterned for Au metal interconnects to various N-type and P-type Au electrodes as required for any circuit and also to connect electronic and optoelectronic devices as required.

In block 457, Au metal is deposited for the Au metal interconnects.

In block 458, the Au metal interconnects are patterned via liftoff.

Note that blocks 456 to 458 can be repeated multiple times where multiple metal interconnect levels are used In block 459, a photoresist mask is deposited and patterned to open the apertures of the optoelectronic and optical devices.

In block 460, the photoresist mask of 459 is used to etch the apertures of the optoelectronic and optical devices. For example, the etching can use SF6 to etch nitride-tungsten-nitride to expose layer 127 of the apertures.

In block 461, the photoresist mask of 459 is removed.

In block 462, the top mirror layers 129 are deposited and cover the exposed apertures. For example, seven (7) pairs of silicon dioxide (SiO2) and titanium dioxide (TiO2) can be deposited using Ion Beam Assisted Deposition (IBAD). The center wavelength for the top mirror layers 129 is typically 980 nm, 850 nm or 1310 nm In block 463, a photoresist mask is deposited and patterned to open bond pads on all devices. This can involve a dry etch of the top mirror layers 129 using Inductively Coupled Plasma Etching (ICP).

In optional steps, the bottom mirror layers that are exposed by the isolation etch of 450 can be subject to oxidation. This operation is useful for the case where the bottom mirror layers formed as part of the layer structure do not function as a suitable DBR mirror. In one embodiment, the bottom mirror layers of aluminum arsenide (AlAs) that are exposed by the isolation etch are subject to a steam ambient that converts the AlAs to aluminum oxide ($Al_xO_y$), which form the bottom DBR mirror.

Note that the top apertures as described above can be configured to allow for light to exit or enter into the active region of the semiconductor layer structure. Alternatively, the apertures can be used to form a passive and/or active in-plane waveguide structures as part of an optoelectronic device or optical device realized in an IC as described herein. Such in-plane waveguides guides the propagation of light in the plane of the IC, and the top aperture formed at the top surface provides for vertical confinement and wave guiding of light for the top portion of the IC wafer. For the passive in-plane waveguide structure, the patterned anode metal can be omitted and ion-implanted regions can be formed below opposite sides of the top aperture to provide for lateral confinement of light within the active region of the semiconductor layer structure disposed below the top aperture.

In embodiments, the epitaxial layer structure and fabrication methodology as described herein can be used to construct an IC with a stacked complementary HFET inverter that includes a NHFET device stacked on a PHFET device. This configuration can help minimize the area of the complementary HFET inverter as part of the IC.

Figure 4A:
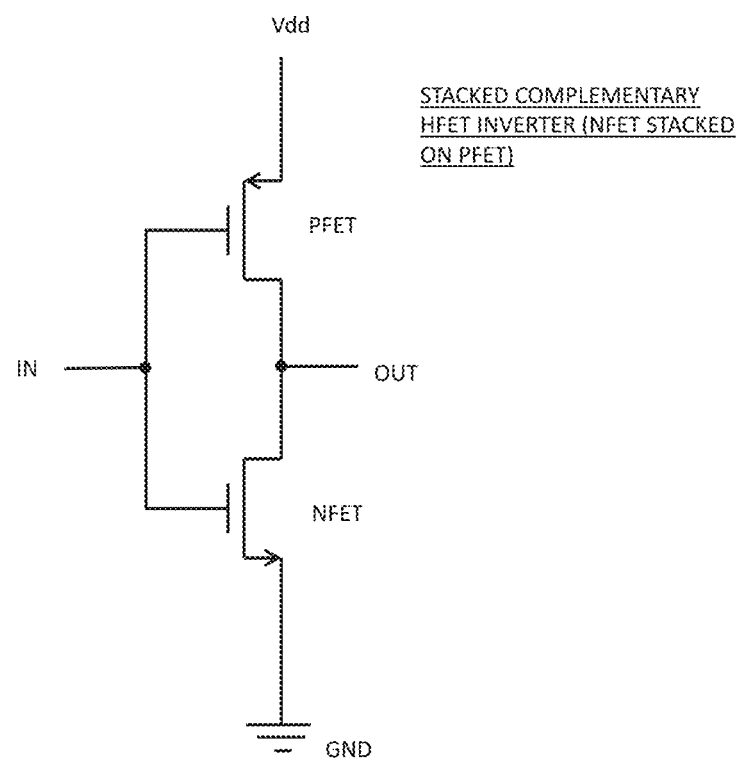
FIG. 4A is a schematic diagram of an exemplary stacked complementary HFET inverter according to the present disclosure.
Figure 4B:
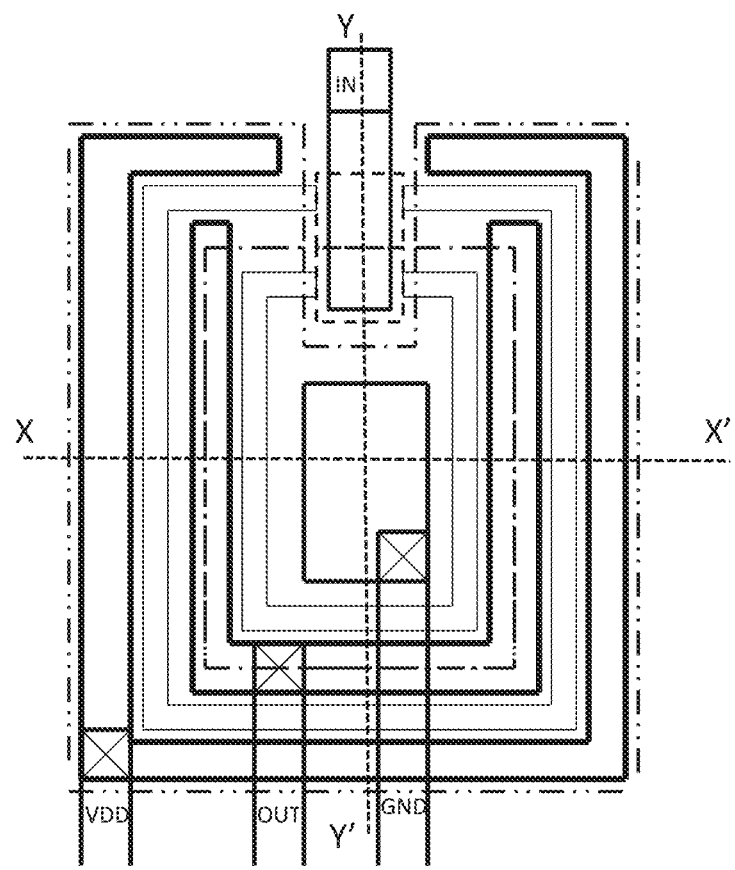
FIG. 4B is schematic top view of an exemplary stacked complementary HFET inverter according to the present disclosure.
Figure 4C:
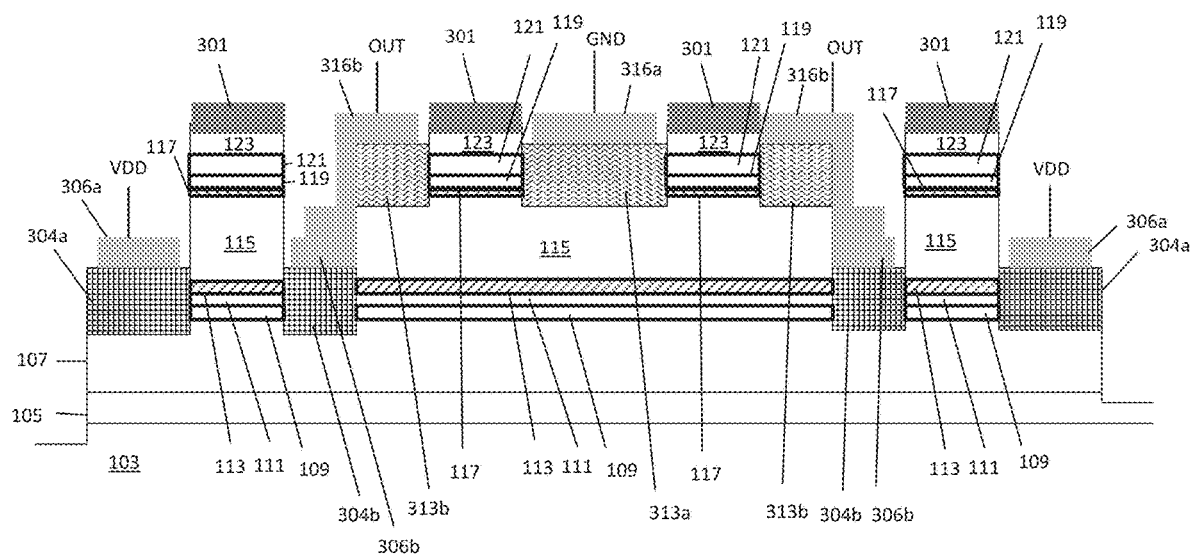
FIG. 4C is schematic cross-section view of the exemplary stacked complementary HFET inverter of FIG. 4B along the section labeled X-X' in FIG. 4B.
Figure 4D:
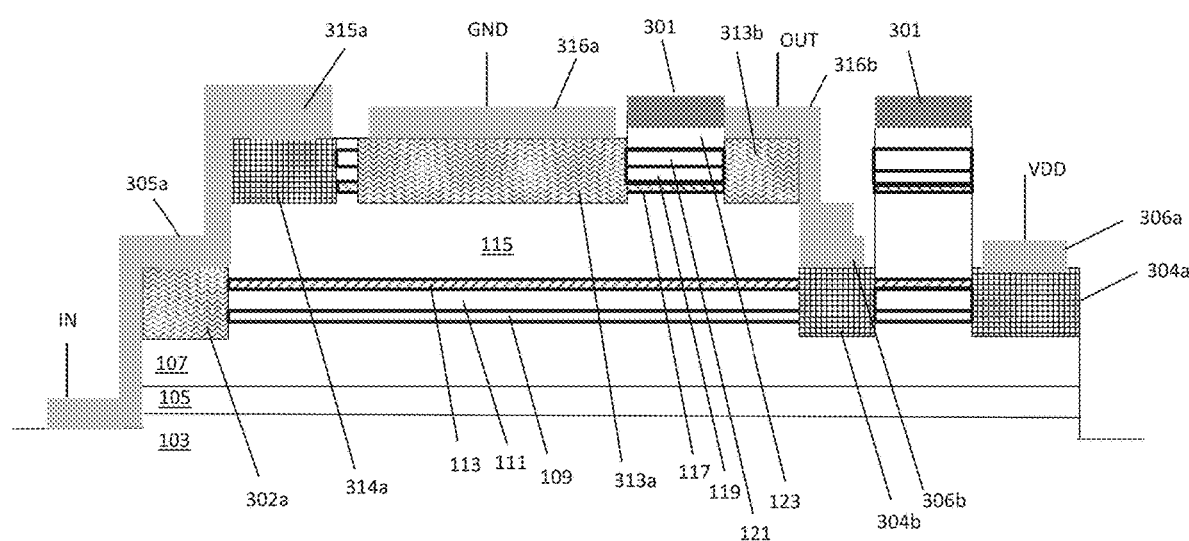
FIG. 4D is schematic cross-section view of the exemplary stacked complementary HFET of FIG. 4B along the section labeled Y-Y' in FIG. 4B.

FIGS. 4A-4D illustrate an embodiment of a stacked complementary HFET inverter that includes an NHFET device stacked on a PHFET device. As best shown in FIG. 4B, the inverter has a generally rectangular layout. In the top central portion of the rectangular layout as best shown in FIGS. 4B and 4D, the gate contact electrode 305a and underlying n-type implant region 302a for the gate of the PHFET device extend along a linear path together with the gate contact electrode 315a and the underlying p-type implant region 314a for the gate of the NHFET device. The gate contact electrode 305a and underlying n-type implant region 302a for the gate of the PHFET device are offset laterally toward the periphery of the layout relative to the gate contact electrode 315a and the underlying p-type implant region 314a for the gate of the NHFET device. The two gate contact electrodes 305a, 305b are interconnected to one another by metal to form the IN terminal of the inverter. In the other portions of the rectangular layout as best shown in FIGS. 4B and 4C, the top feature 301 that overlies the channel for PHFET device along with the source and drain contact electrodes 306a, 306b and underlying p-type implant regions 304a, 304b for the drain and source drain terminals of the PHFET device extend in a segmented U-shaped manner about the periphery of the layout with two segments that extend toward the linear path of the gate of the PHFET device. Furthermore, the top feature 301 that overlies the channel for NHFET device along with the drain contact electrode 316b and underlying n-type implant region 313b for the drain terminal of the NHFET device extend in a similar segmented U-shape manner that is offset laterally toward the central region of the layout. The source contact electrode 316a and underlying n-type implant region 313a for the source terminal of the NHFET device is disposed in the central region of the layout. The drain contact electrode 306b of the PHFET device is interconnected to the drain contact electrode 316b of the NHFET device by metal to form the OUT terminal of the inverter. The source contact electrode 306a of the PHFET device forms the VDD terminal of the inverter. And the source contact electrode 316a of the NHFET forms the GND terminal of the inverter.

Figure 5A:
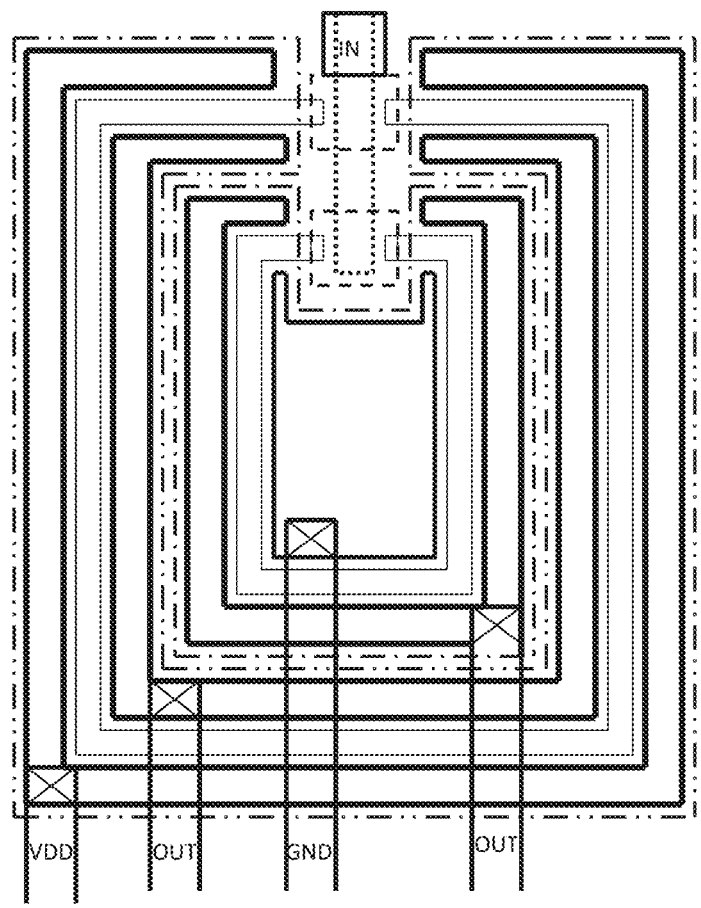
FIGS. 5A and 5B are is schematic top views of other exemplary stacked complementary HFET inverter according to the present disclosure.
Figure 5B:
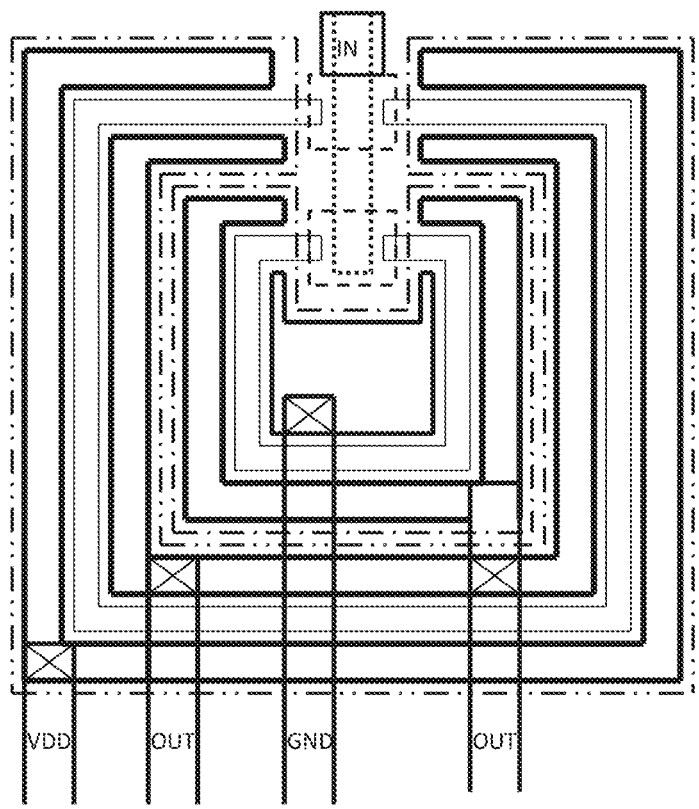

FIGS. 5A and 5B illustrate other exemplary embodiments of a stacked complementary HFET inverter that includes an NHFET device stacked on a PHFET device. These embodiments are similar to the embodiment of FIGS. 4A-4D except that the drain terminals of the NHFET and PHFET devices are maintained electrically and physically separate from one another. The embodiment of FIG. 5B can provide for higher drive current, i.e. fanout, for the inverter.

Figure 6A:
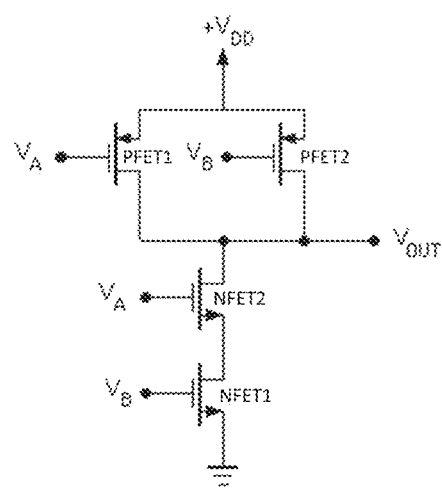
FIG. 6A is a schematic diagram of an exemplary 2-input NAND gate with stacked complementary HFET devices according to the present disclosure.
Figure 6B:
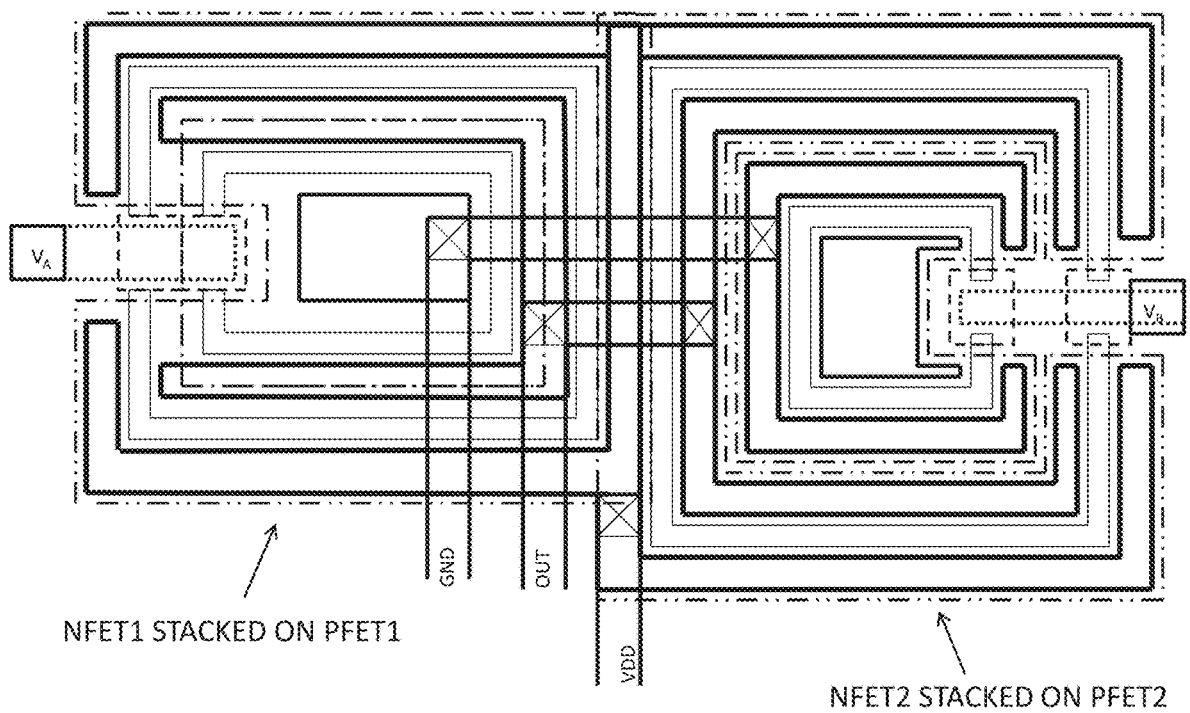
FIG. 6B is a schematic top view of an exemplary 2-input NAND gate with stacked complementary HFET devices according to the present disclosure.
Figure 7A:
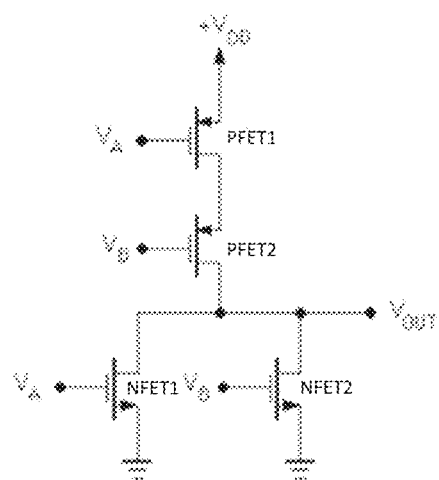
FIG. 7A is a schematic diagram of an exemplary 2-input NOR gate with stacked complementary HFET devices according to the present disclosure.
Figure 7B:
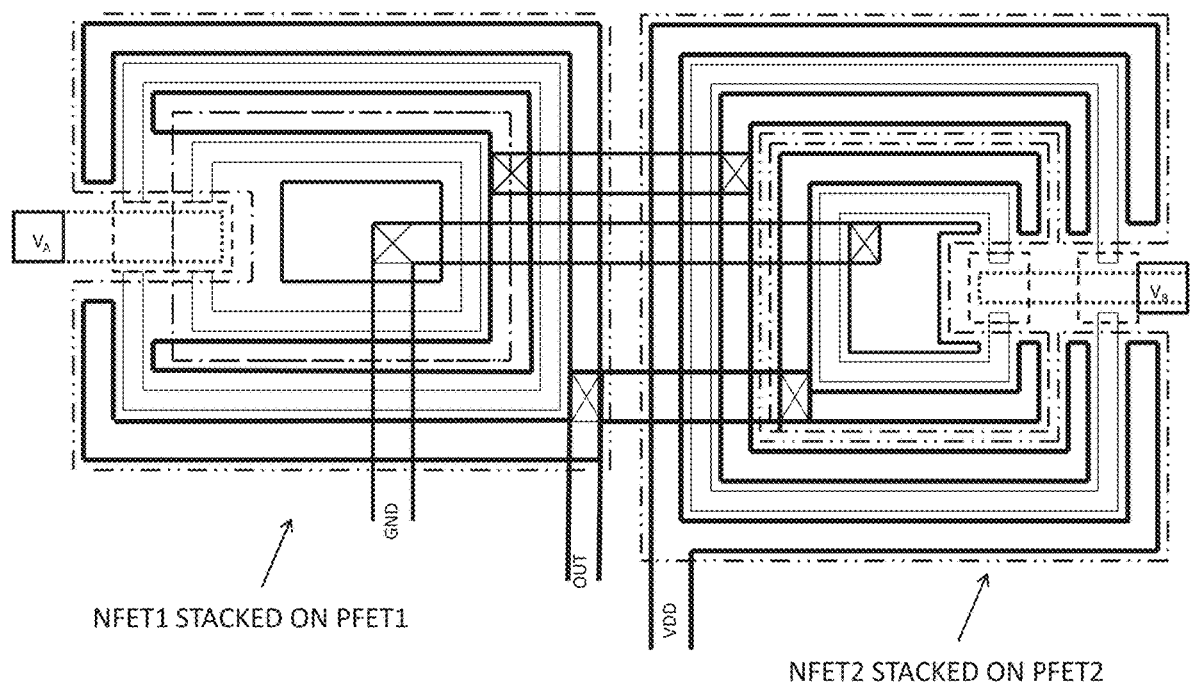
FIG. 7B is a schematic top view of an exemplary 2-input NOR gate with stacked complementary HFET devices according to the present disclosure.
Figure 8A:
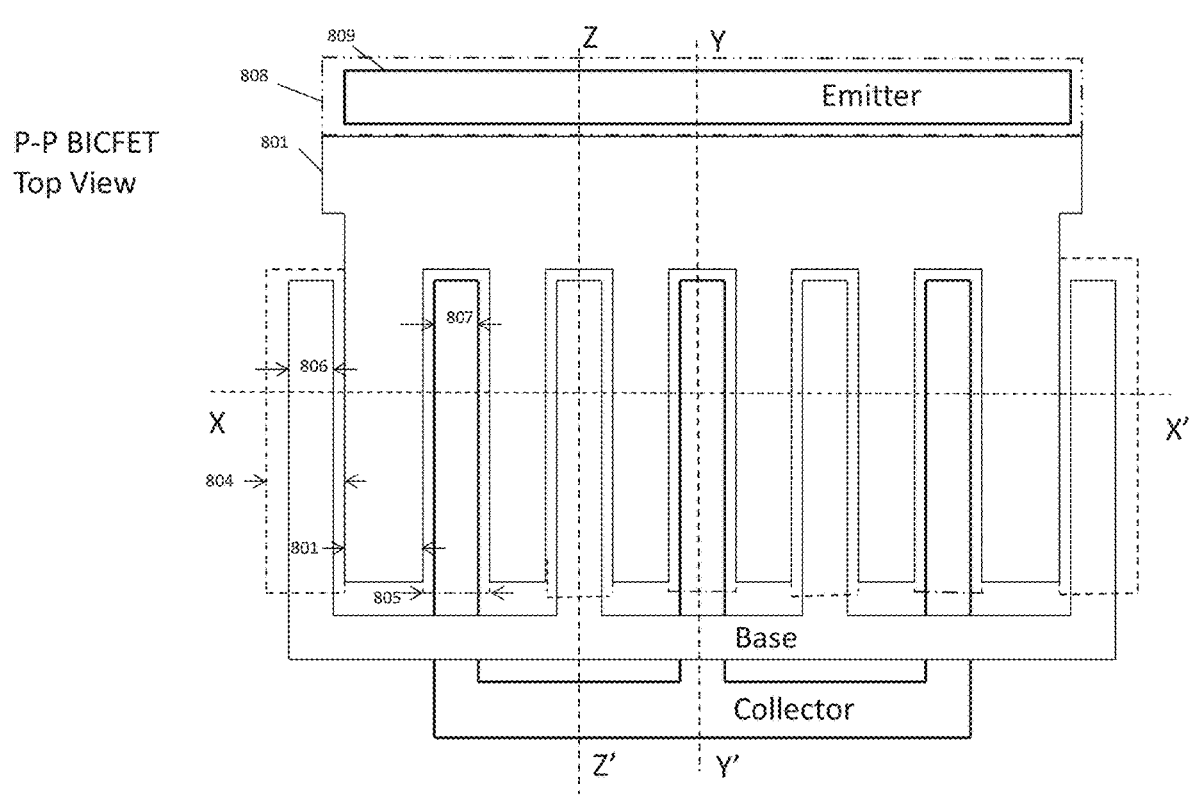
FIG. 8A is schematic top view of an exemplary P-P BICFET device according to the present disclosure.
Figure 8B:
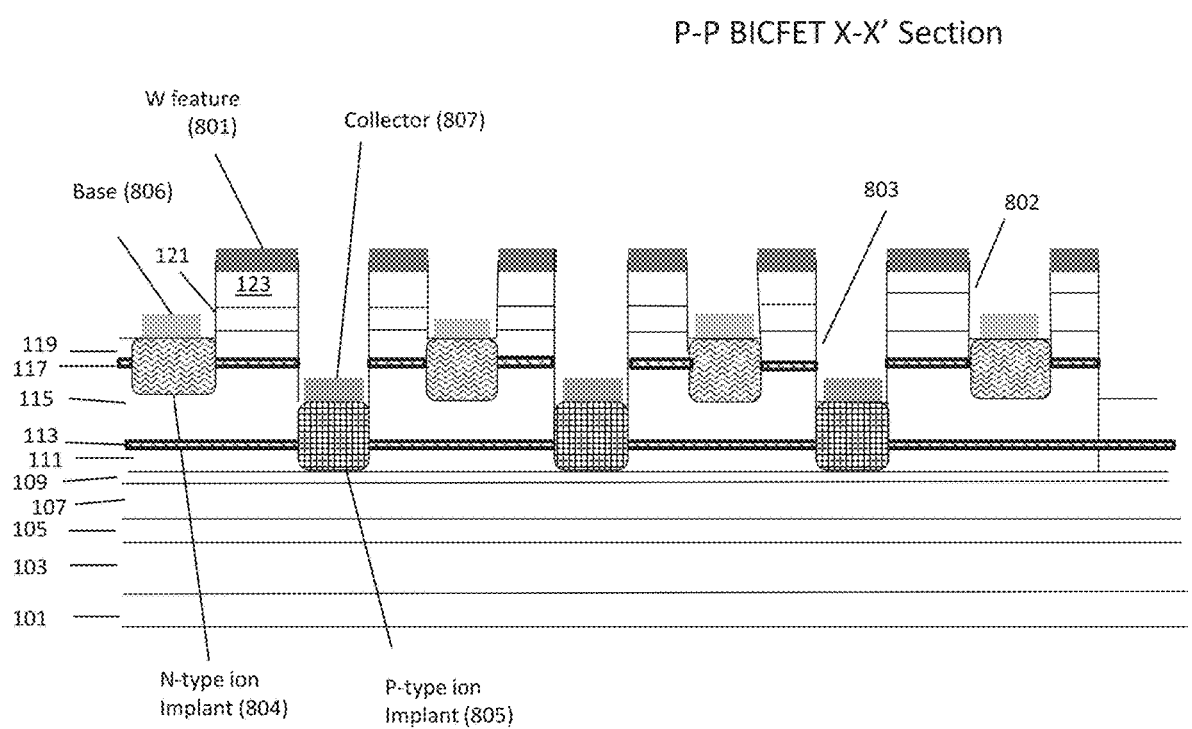
FIG. 8B is schematic cross-section view of the exemplary P-P BICFET device of FIG. 8A along the section labeled X-X' in FIG. 8A.
Figure 8C:
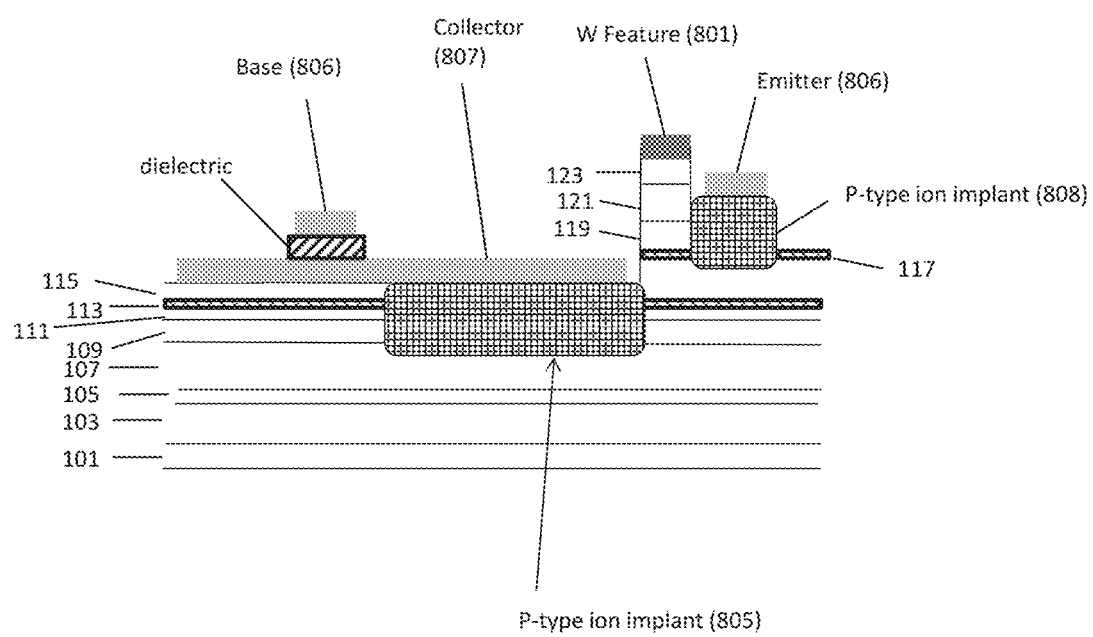
FIG. 8C is schematic cross-section view of the exemplary P-P BICFET device of FIG. 8A along the section labeled Y-Y' in FIG. 8A.
Figure 8D:
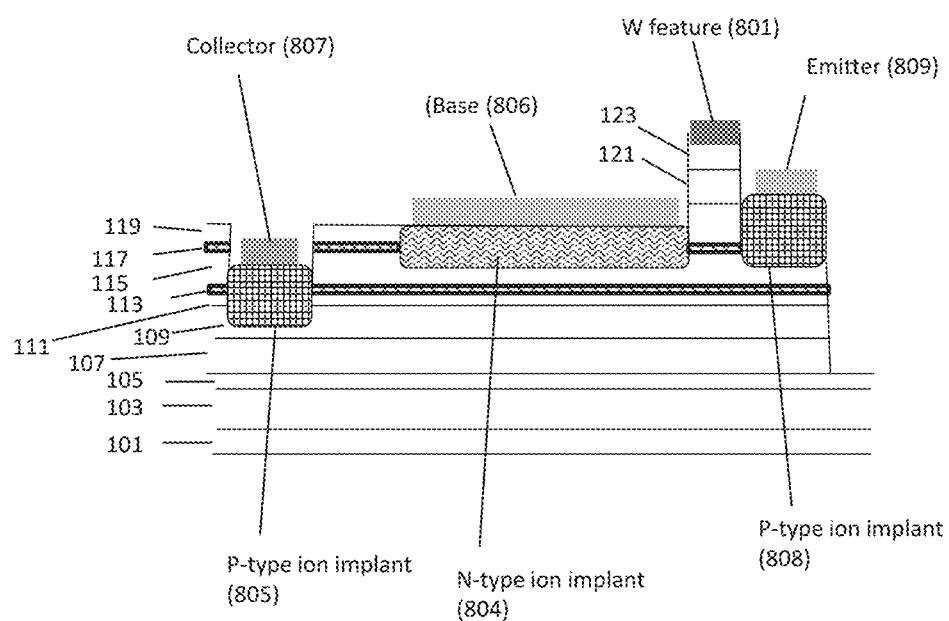
FIG. 8D is schematic cross-section view of the exemplary P-P BICFET device of FIG. 8A along the section labeled Z-Z' in FIG. 8A.
Figure 9A:
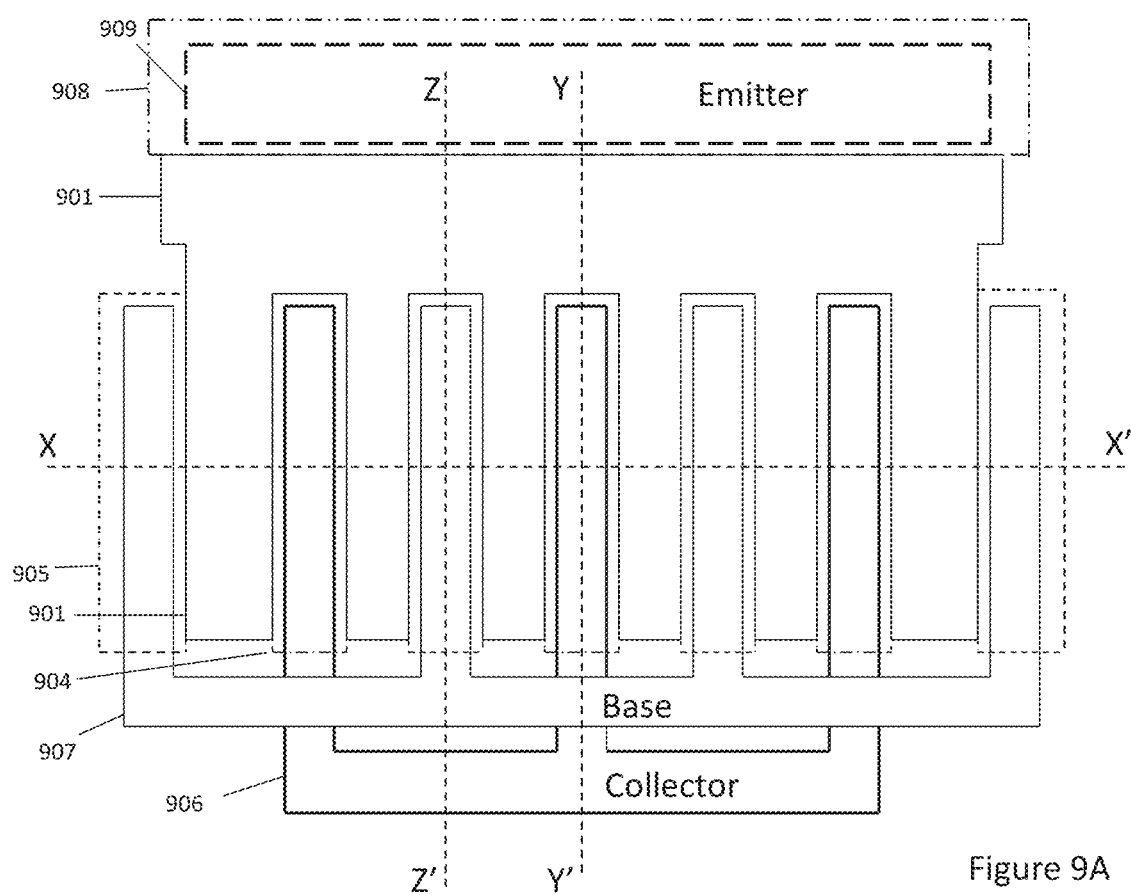
FIG. 9A is schematic top view of an exemplary N-N BICFET device according to the present disclosure.
Figure 9B:
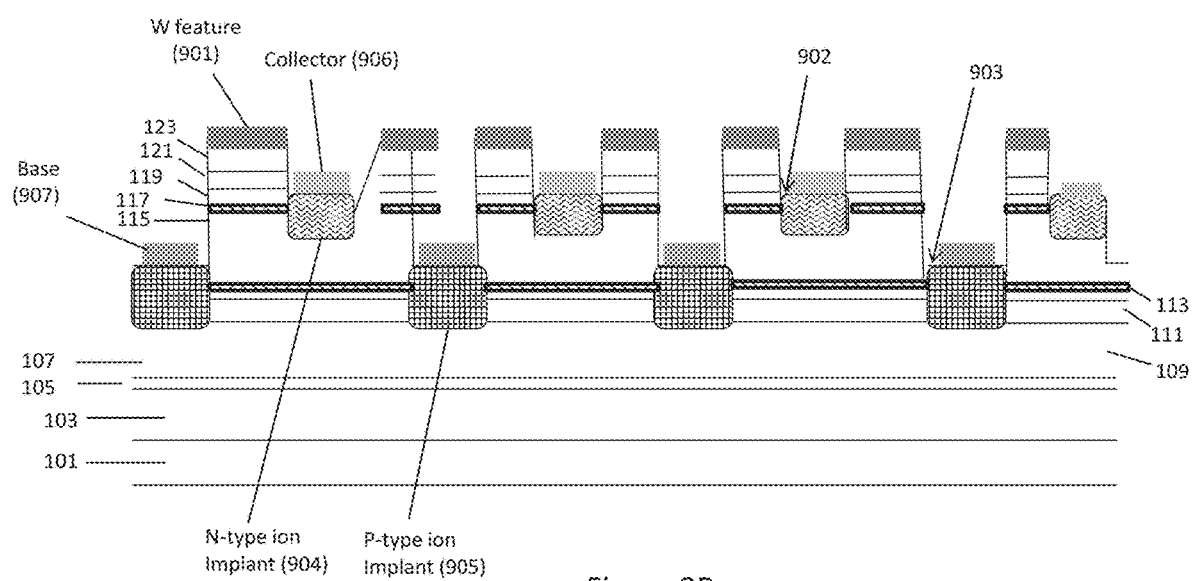
FIG. 9B is schematic cross-section view of the exemplary N-N BICFET device of FIG. 9A along the section labeled X-X' in FIG. 9A.
Figure 9C:
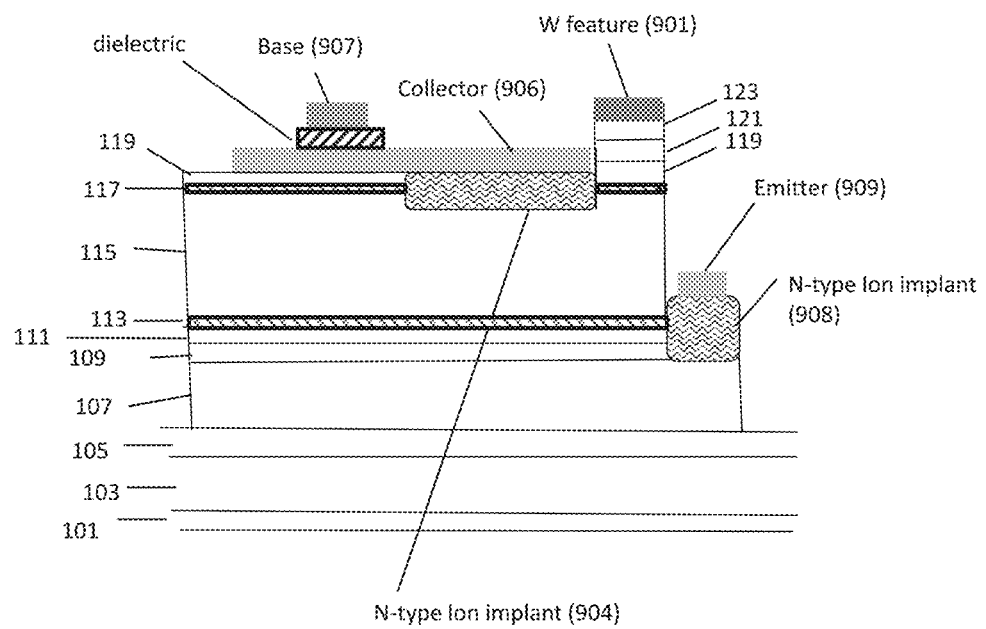
FIG. 9C is schematic cross-section view of the exemplary N-N BICFET device of FIG. 9A along the section labeled Y-Y' in FIG. 9A.
Figure 9D:
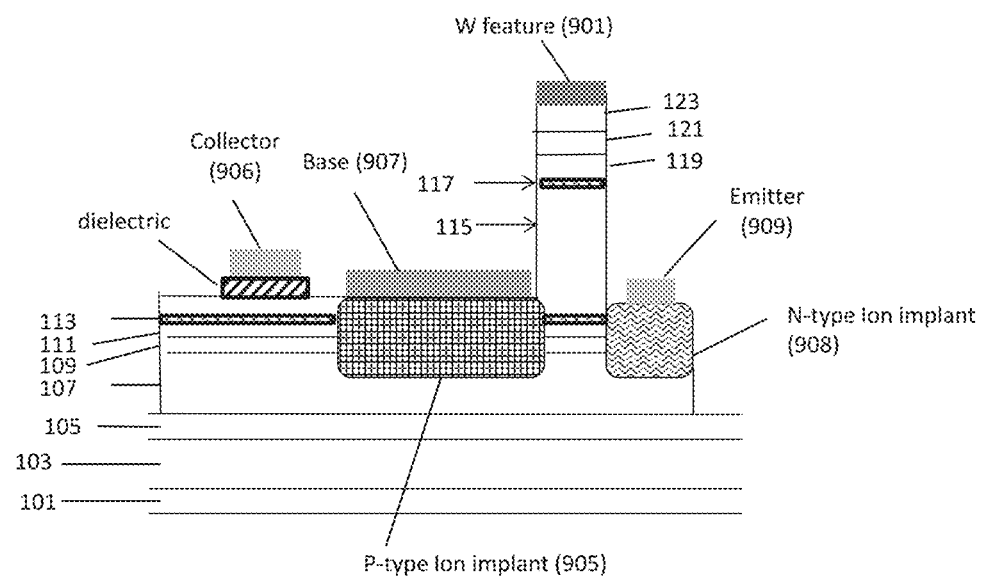
FIG. 9D is schematic cross-section view of the exemplary N-N BICFET device of FIG. 9A along the section labeled Z-Z' in FIG. 9A.

The embodiments of FIGS. 5A and 5B can be used as building blocks for other complementary HFET circuits as part of the IC such as NOR and NAND gates, flip flops, counters, etc. For example, FIGS. 6A and 6B illustrate a 2-INPUT NAND GATE built from the Stacked Complementary HFET devices. In another example, FIGS. 7A and 7B illustrate a 2-INPUT NOR GATE built from the Stacked Complementary HFET devices.

The epitaxial layer structure of the present application can also be configured to realize bipolar inversion channel field-effect transistors (BICFETs) with either an n-type modulation doped quantum well inversion channel base region (P-P BICFET) or a p-type modulation doped quantum well inversion channel base region (N-N BICFET).

As shown in FIGS. 8A-8D, the P-P BICFET device employs interdigitated features 801 that overlie n-type modulation doped quantum well inversion channel base regions, which include QW channel(s) realized in the n-type modulation doped QW structure 117. The interdigitated features 801 can be formed from a refractory metal such as tungsten. The corresponding interdigitated base regions (that underlie the features 801) are operably coupled to interdigitated base contact electrode parts 806 via n-type ion implant regions 804. Interdigitated collector regions in the p-type modulation doped QW structure 113 are operably coupled to interdigitated collector contact electrode parts 807 via p-type ion implant regions 805. An emitter electrode 806 is electrically coupled to the n-type modulation doped QW structure 117 of the interdigitated based regions via a p-type ion implant region 808. The P-P BICFET device is a bipolar junction type transistor which can be operated in an active mode by applying a forward bias to the PN junction of the emitter and base regions while applying a reverse bias to the PN junction of the base and collector regions, which causes holes to be injected from the emitter terminal electrode to the collector terminal electrode. Because the holes are positive carriers, their injection contributes to current flowing out of the collector terminal electrode as well as current flowing into the emitter terminal electrode. The bias conditions also cause electrons to be injected from the base to the emitter, which contributes to current flowing out of the base terminal electrode as well as the current flowing into the emitter terminal electrode. FIGS. 8A-8D illustrate the following features of the P-P BICFET device:
  i) 801—W feature patterned on mesa; formed by etch to layer 123;
  ii) 802—Mesas formed by etch into layer 123 for N-type implant;
  iii) 803—Mesas formed by etch into layer 115 for P-type implant;
  iv) 804—N-type Ion implant for Base;
  v) 805—P type Ion implant for Collector;
  vi) 806—N-type Au for Base;
  vii) 807—P-type Au for Collector;
  viii) 808—P-type Ion implant for Emitter; and
  ix) 809—P-type Au for Emitter.

As shown in FIGS. 9A-9D, the N-N BICFET device employs interdigitated features 901 that overlie p-type modulation doped quantum well inversion channel base regions, which include QW channel(s) realized in the p-type modulation doped QW structure 113. The interdigitated features 901 can be formed from a refractory metal such as tungsten. The corresponding interdigitated base regions (that underlie the features 901 are operably coupled to interdigitated base contact electrode parts 907 via p-type ion implant regions 905. The interdigitated features 901 also overlie interdigitated collector regions in the n-type modulation doped QW structure 117, which are operably coupled to interdigitated collector contact electrode parts 906 via n-type ion implant regions 904. An emitter electrode 909 is electrically coupled to the p-type modulation doped QW structure 113 of the interdigitated based regions via an n-type ion implant region 908. The N-N BICFET device is a bipolar junction type transistor which can be operated in an active mode by applying a forward bias to the PN junction of the emitter and base regions while applying a reverse bias to the PN junction of the base and collector regions, which causes electrons to be injected from the emitter terminal electrode to the collector terminal electrode. Because the electrons are negative carriers, their injection contributes to current flowing into the collector terminal electrode as well as current flowing out of the emitter terminal electrode. The bias conditions also cause holes to be injected from the base to the emitter, which contributes to current flowing into the base terminal electrode as well as the current flowing out of the emitter terminal electrode. FIGS. 9A-9D illustrate the following features of the N-N BICFET device:
  i) 901—W feature patterned on mesa; formed by etch to layer 123;
  ii) 902—Mesas formed by etch into layer 119 for N-type implant;
  iii) 903—Mesas formed by etch into layer 115 for P-type implant;
  iv) 904—N-type Ion implant for Collector;
  v) 905—P-type Ion implant for Base;
  vi) 906—N-type Au for Collector;
  vii) 907—P-type Au for Base;
  viii) 908—N-type Ion implant for Emitter; and
  ix) 909—N-type Au for Emitter.

The epitaxial layer structure and fabrication methodology as described herein can also be used to realize a variety of optoelectronic devices and optical devices as part of an IC. Examples of such optoelectronic devices and optical devices are illustrated in FIGS. 10A to 23. Such devices can employ a resonant cavity for optical signal emission and/or detection.

In one configuration, the resonant cavity of the device can be configured as a vertical cavity and light may enter and exit the vertical cavity through an optical aperture (not shown) in the top surface of the device. In this configuration, the distance between the top mirror layers 129 and the bottom mirror layers 103 represents the length of the optical cavity and can be set to correspond to the designated wavelength (such as 1 to 3 times the designated wavelength). This distance can take into account the penetration depth of the light into the bottom and top mirror layers. This distance is controlled by adjusting the thickness of one or more of the layers therebetween to enable this condition.

In another configuration, the resonant cavity of the device can be configured as a whispering gallery or closed-loop microresonator to support propagation of an optical mode signal within a waveguide region formed from the device structure. For the whispering gallery microresonator, the waveguide region can be a disk-like structure that supports propagation of a whispering gallery mode. The geometry of the disk-like structure is tuned to the particular wavelength of the whispering gallery mode. For example, the circumference of the disk-like structure can be configured to correspond to an integral number of wavelengths of a standing wave that circulates in the disk-like structure. For relatively small disk-like structures (e.g., 10 μm in diameter or less), the free spectral range FSR is large enough such that the diameter of the disk-like structure can dictate the particular wavelength of the whispering gallery mode. For the closed-loop microresonator, the waveguide can support circulating propagation of an optical mode that follows a circular optical path, a rectangular optical path, an oval optical path, or other suitable geometry. The optical path length of the closed-loop waveguide is tuned to the particular wavelength of the optical mode signal that is to propagate in the closed-loop waveguide. At least one coupling waveguide is formed integral to and adjacent the whispering gallery or closed-loop microresonator. The coupling waveguide provides for evanescent coupling of light to and/or from the whispering gallery or closed-loop microresonator. Specifically, for the laser, the whispering gallery mode produced by the whispering gallery microresonator or the optical mode signal that circulates in the closed-loop waveguide of the closed-loop microresonator is coupled to the coupling waveguide to produce an output optical signal that propagates in the coupling waveguide for output therefrom. For the detector, an input optical light is supplied to the coupling waveguide, which couples the input optical light as a whispering gallery mode in the whispering gallery microresonator for detection or as an optical mode signal that circulates in the closed-loop waveguide of the closed-loop microresonator for detection.

Figure 10A:
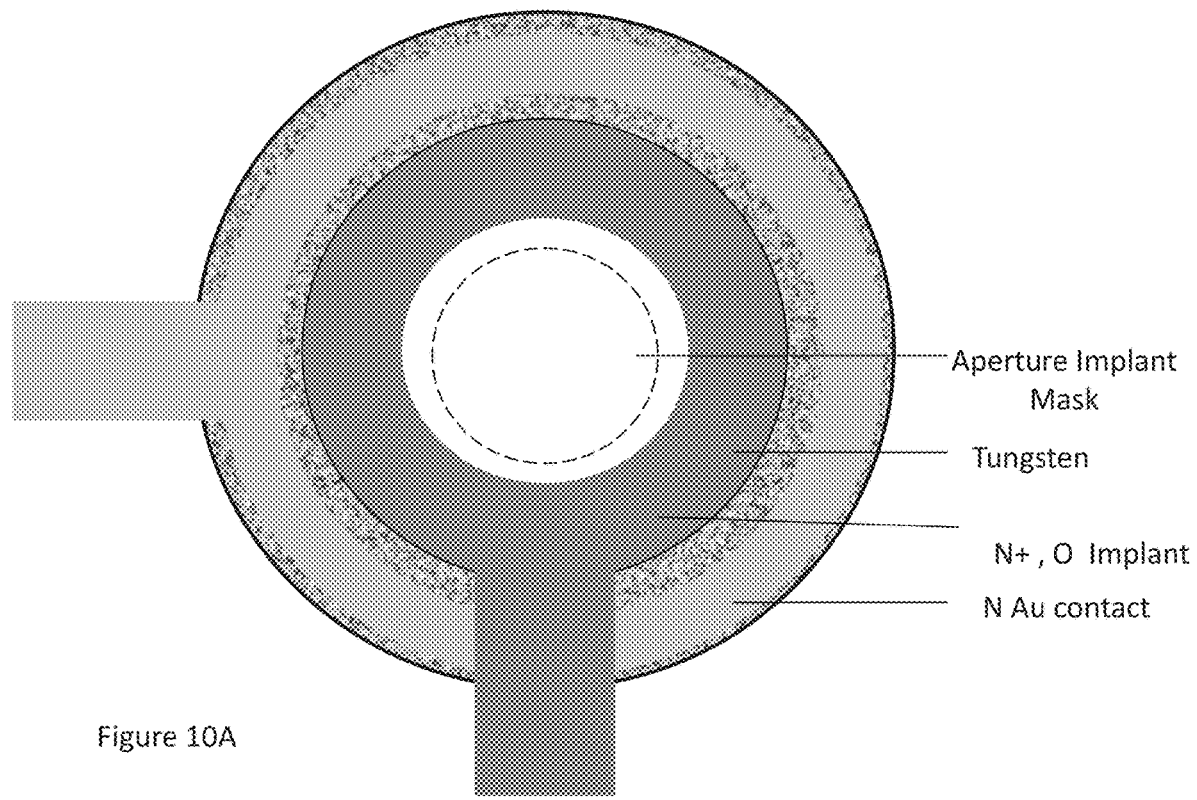
FIGS. 10A to 23 are schematic diagrams of exemplary optoelectronic devices and optical devices that employ the epitaxial semiconductor layer structure of FIGS. 1 and/or 2A-2B and associated fabrication methodology as described herein.
Figure 10B:
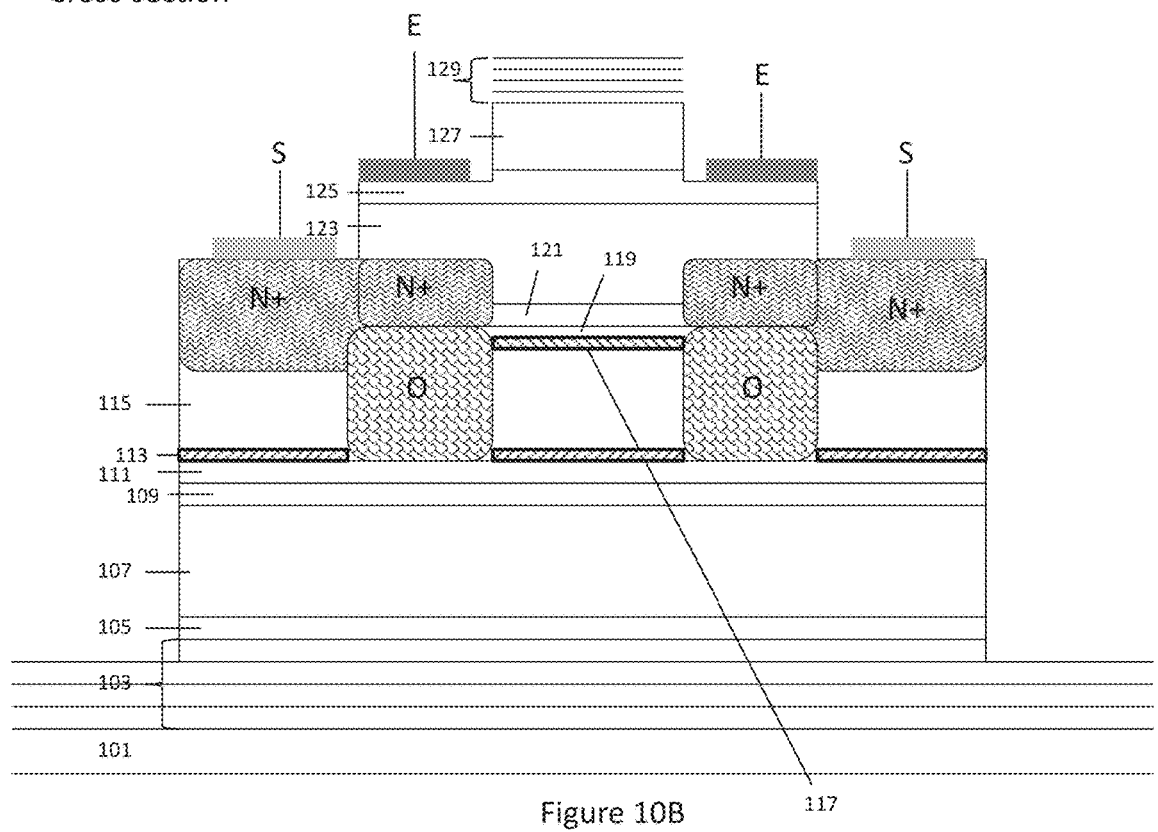

FIGS. 10A and 10B illustrate an HFET VCSEL diode laser realized from the epitaxial layer structure and fabrication methodology as described herein. In other embodiments, an array of HFET VCSEL devices can be integrally formed with a common top emitter electrode and common source electrode.

Figure 11A:
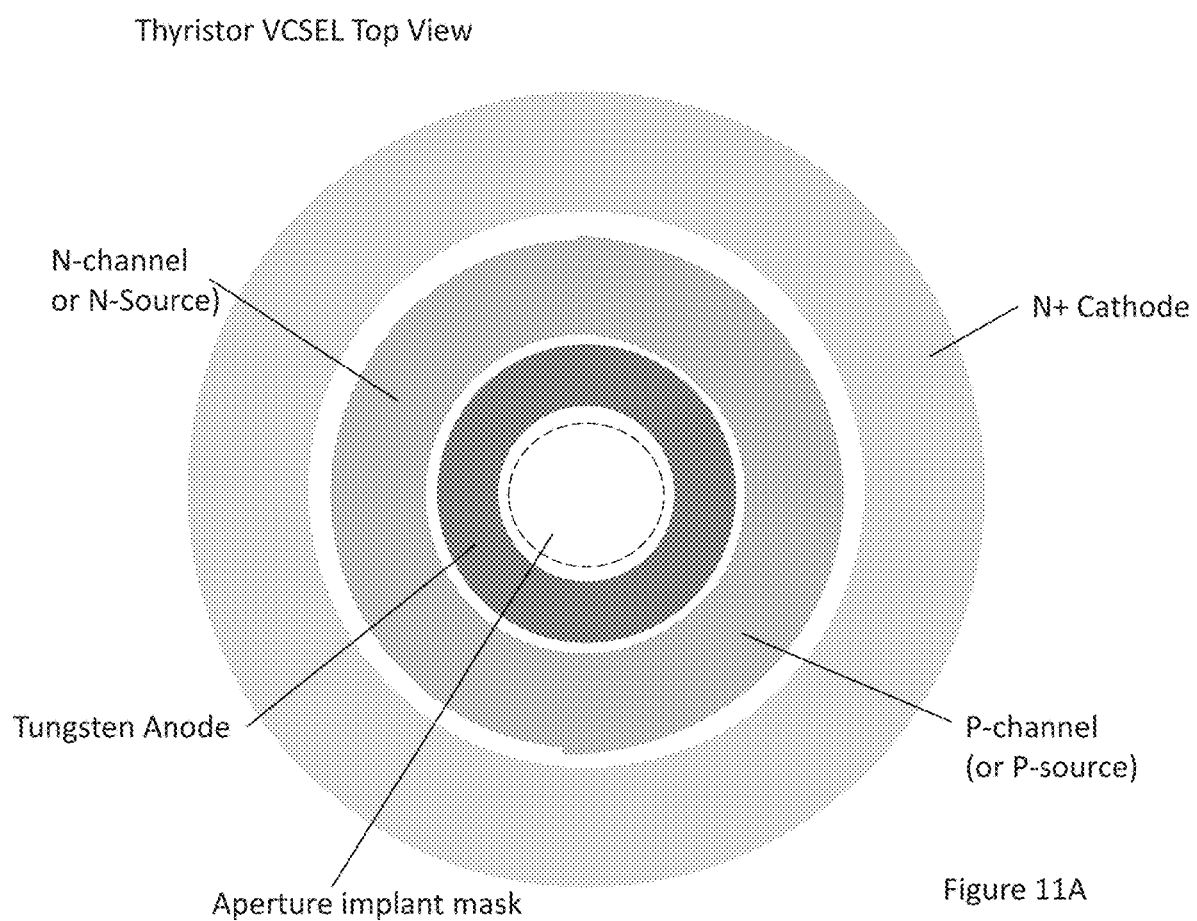
Figure 11B:
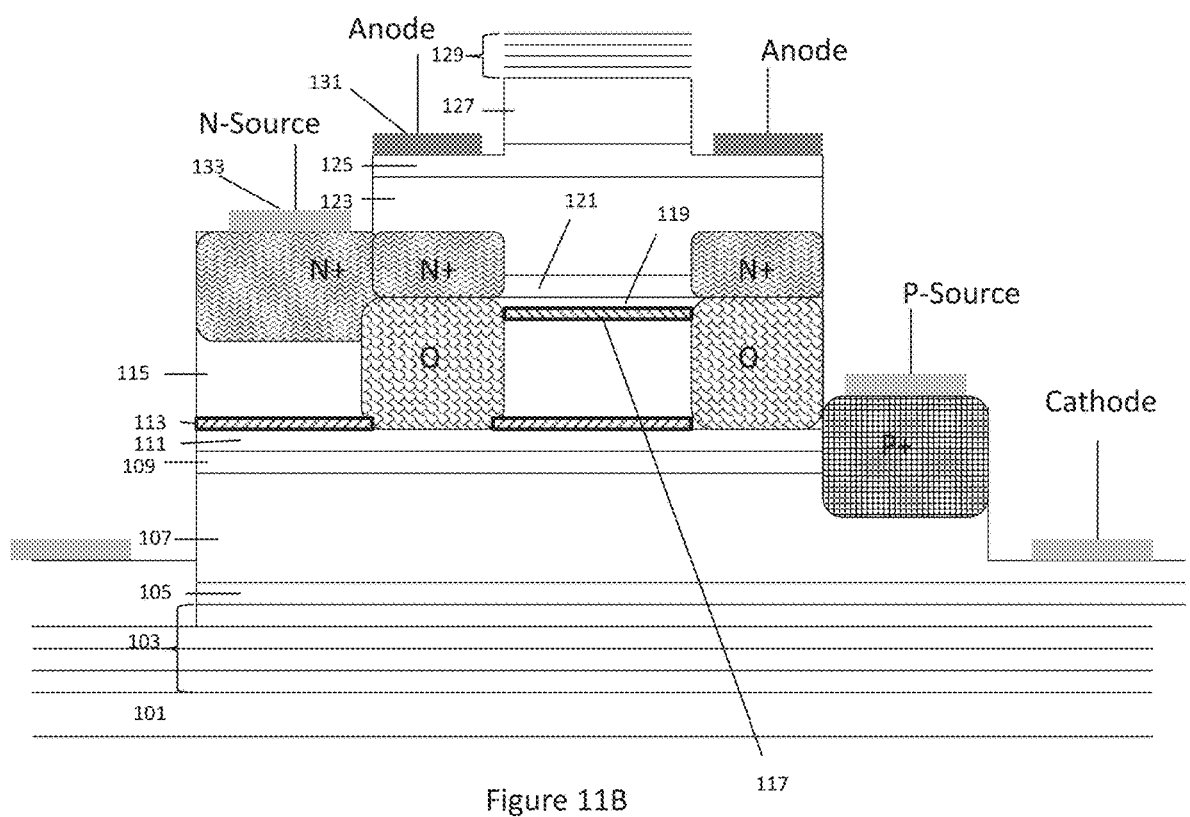
Figure 12A:
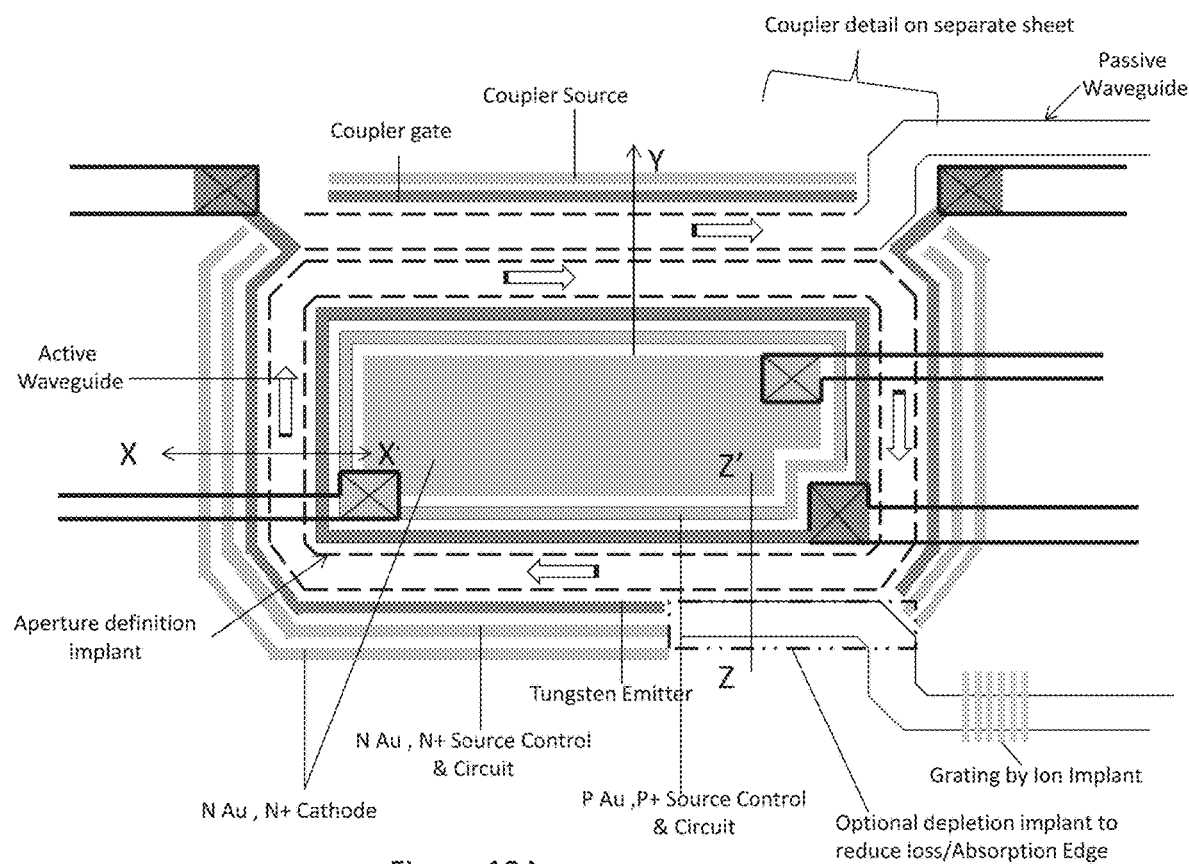
Figure 12B:
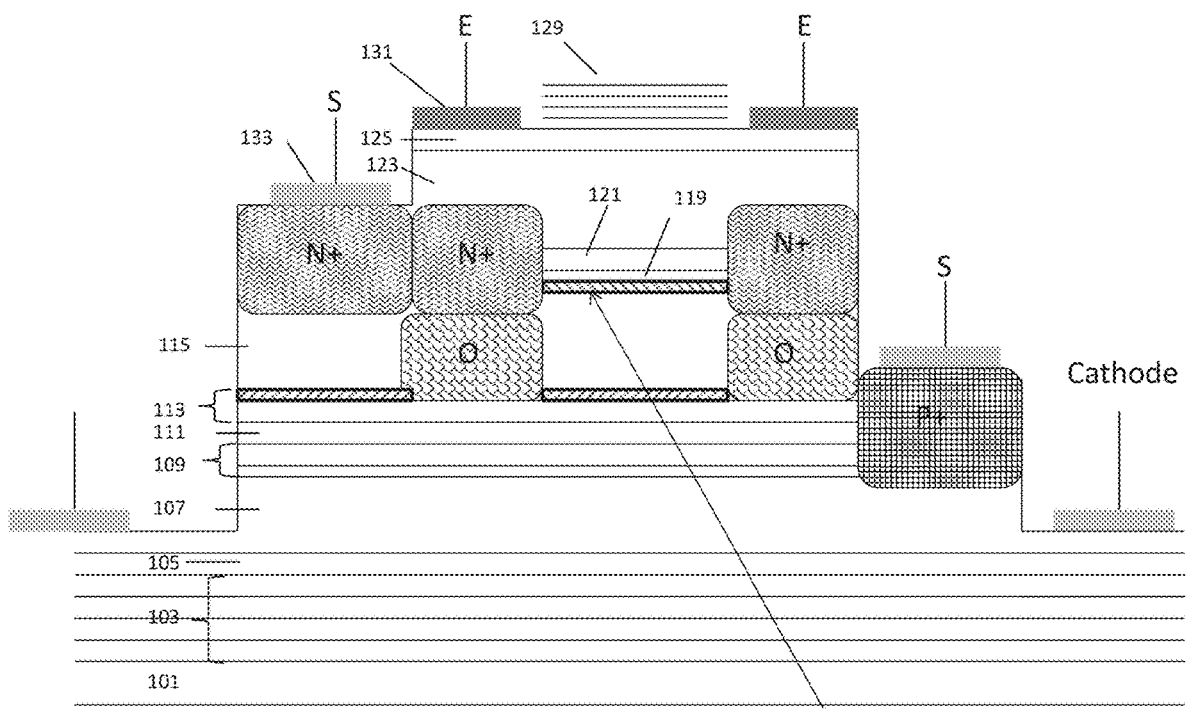
Figure 12C:
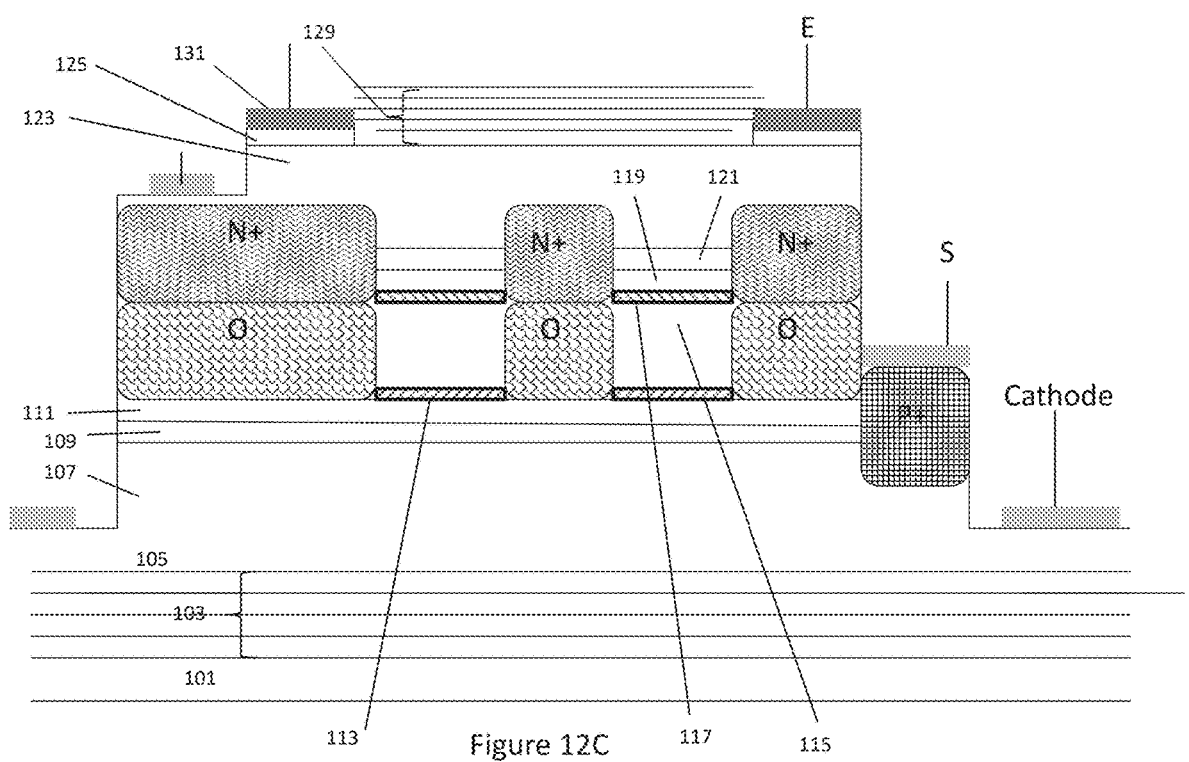
Figure 12D:
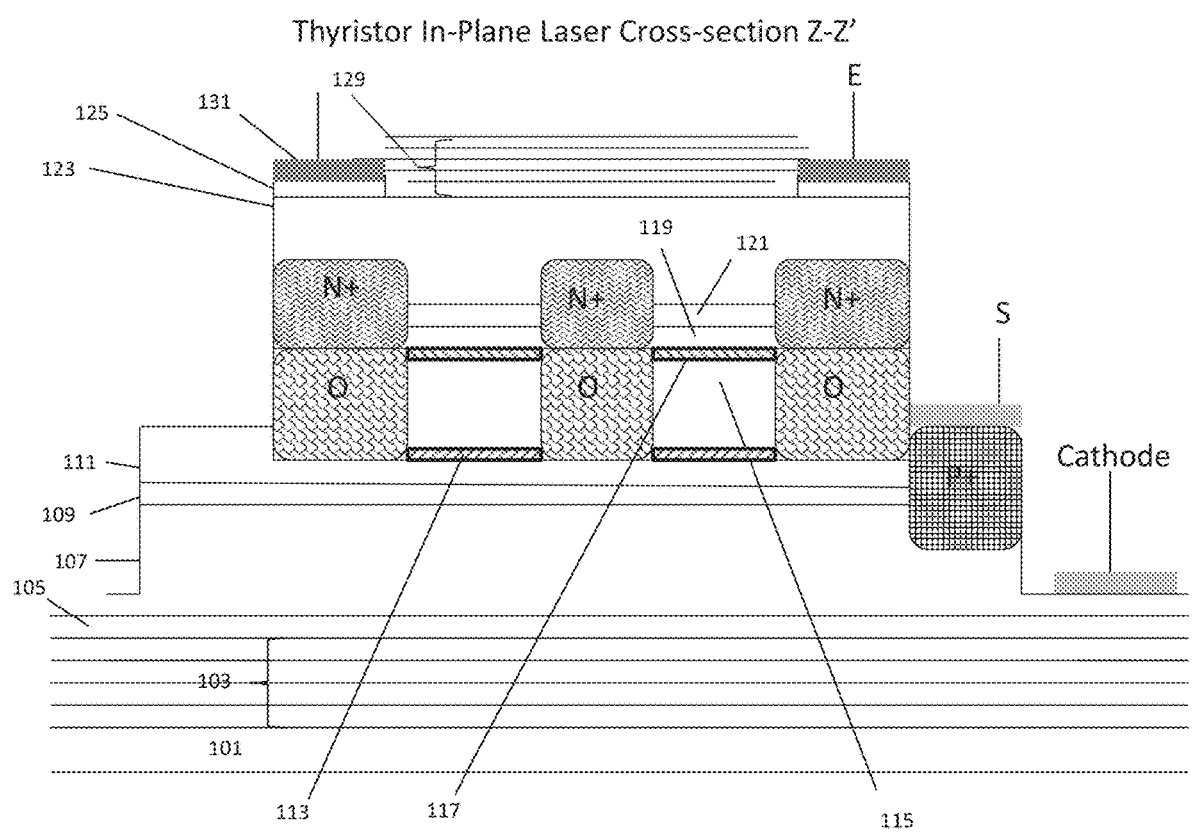

FIGS. 11A and 11B illustrate an HFET VCSEL thyristor laser realized from the epitaxial layer structure and fabrication methodology as described herein.

FIGS. 12A-12D illustrate a thyristor in-plane laser realized from the epitaxial layer structure and fabrication methodology as described herein.

Figure 13A:
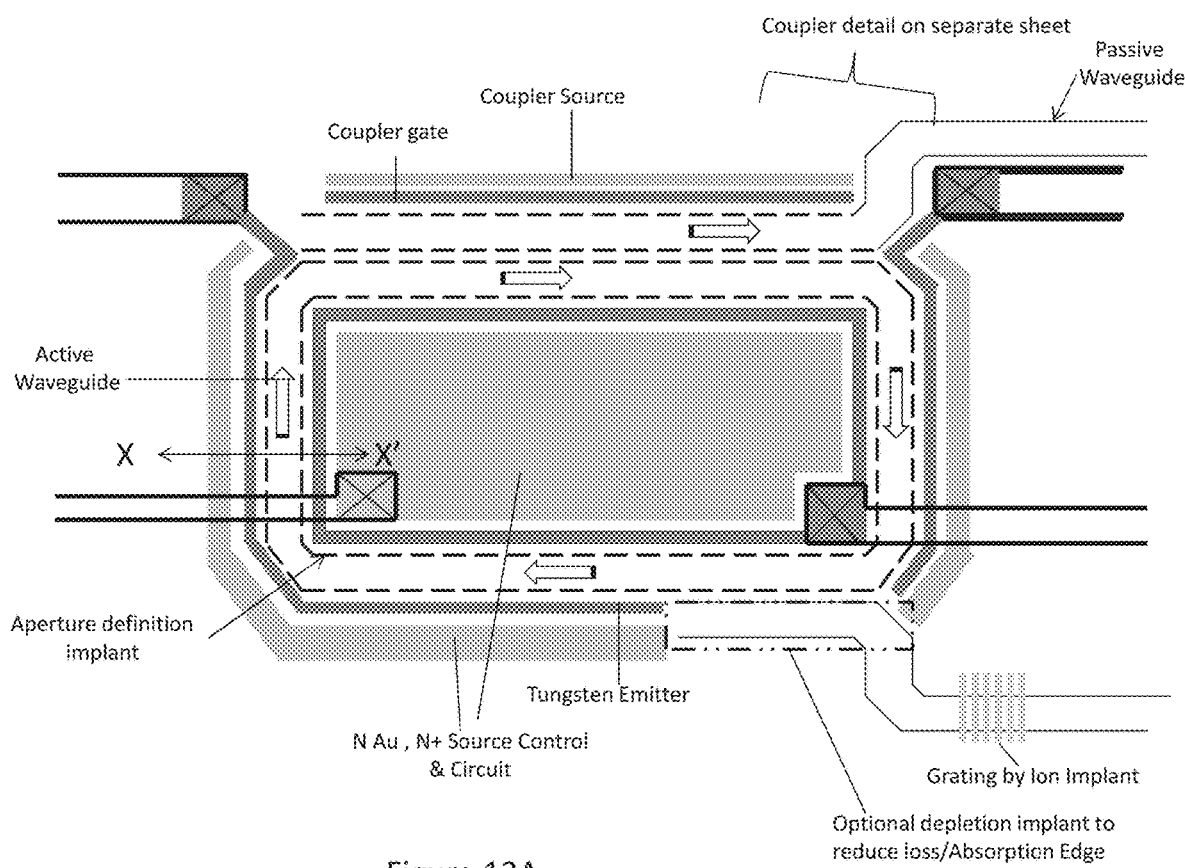
Figure 13B:
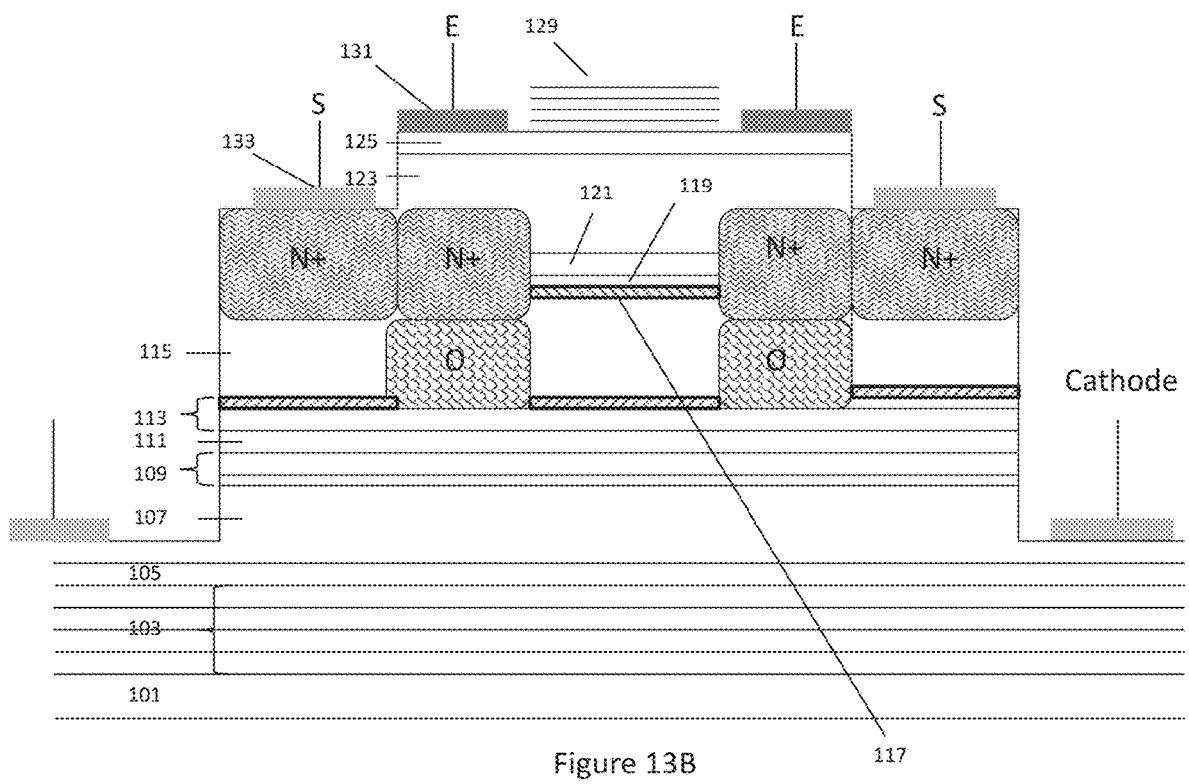

FIGS. 13A and 13B illustrate an HFET in-plane laser realized from the epitaxial layer structure and fabrication methodology as described herein.

Figure 14:
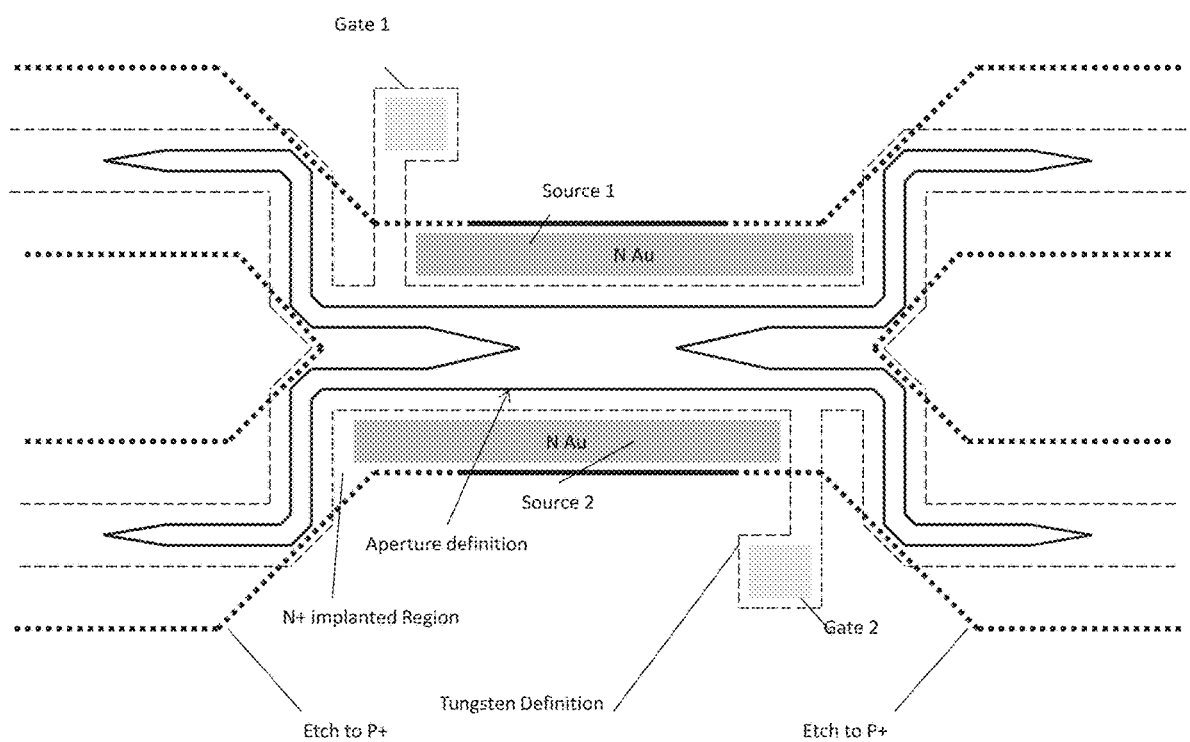

FIG. 14 illustrates a Dual-Input Directional Coupler realized from the epitaxial layer structure and fabrication methodology as described herein.

Figure 15:
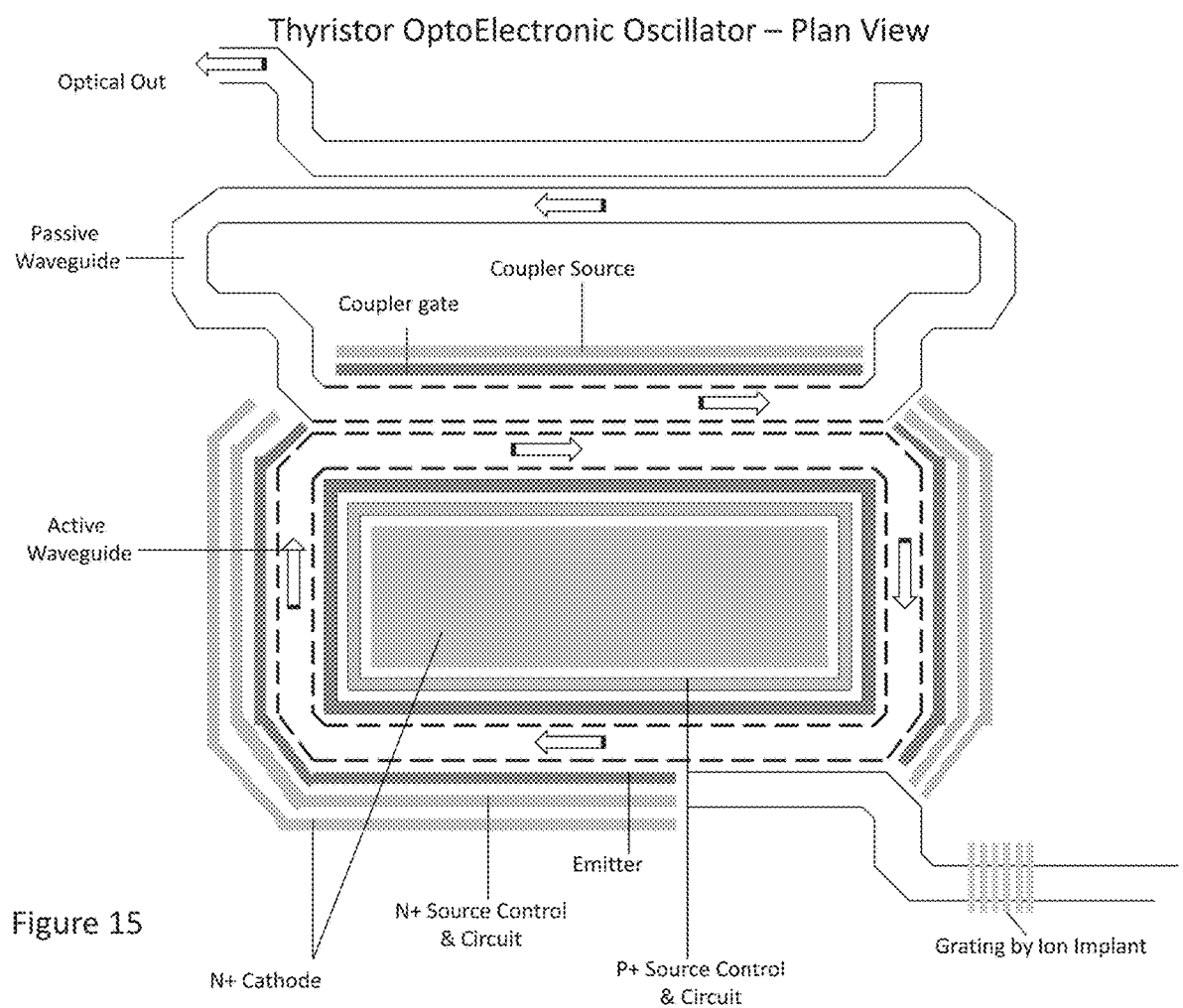

FIG. 15 illustrates a thyristor optoelectronic oscillator realized from the epitaxial layer structure and fabrication methodology as described herein.

Figure 16:
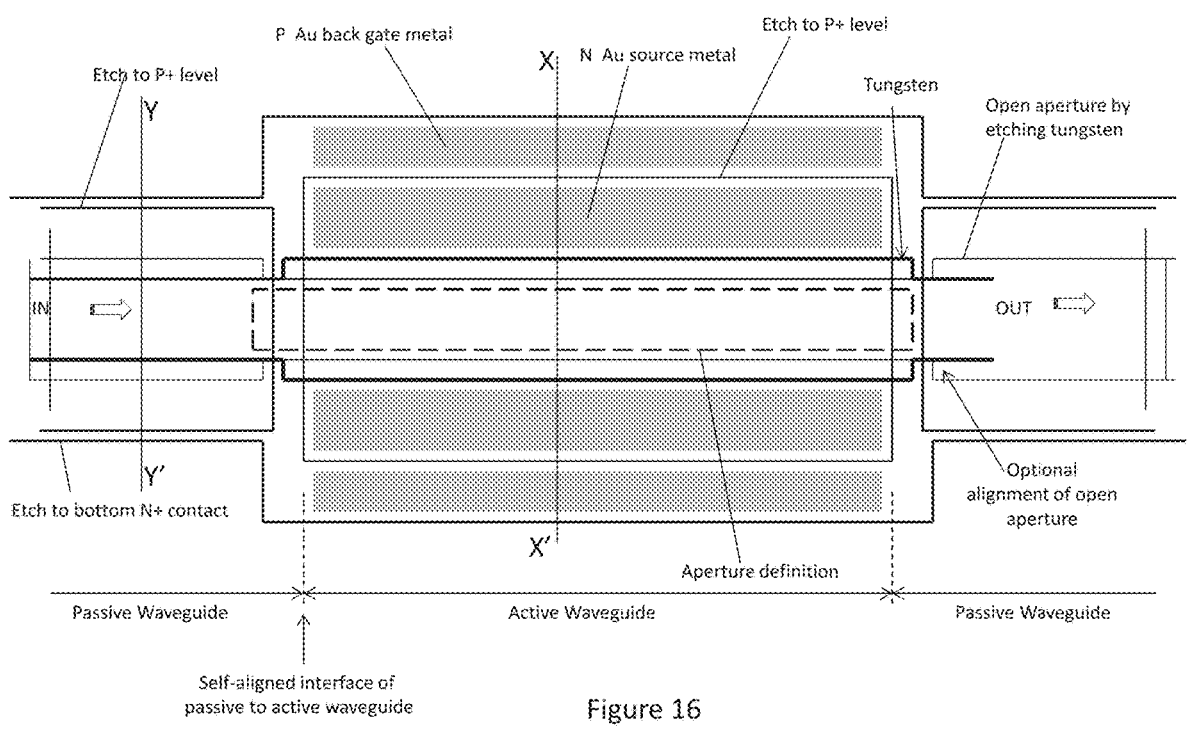
Figure 17:
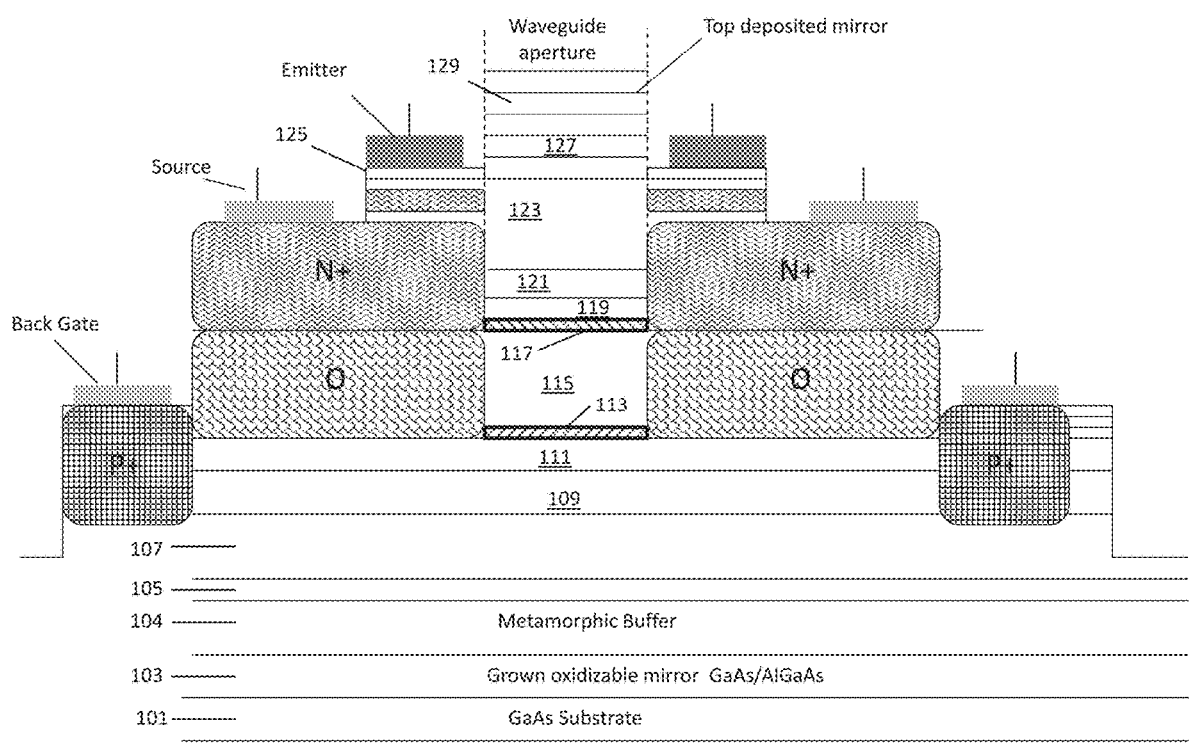
Figure 18:
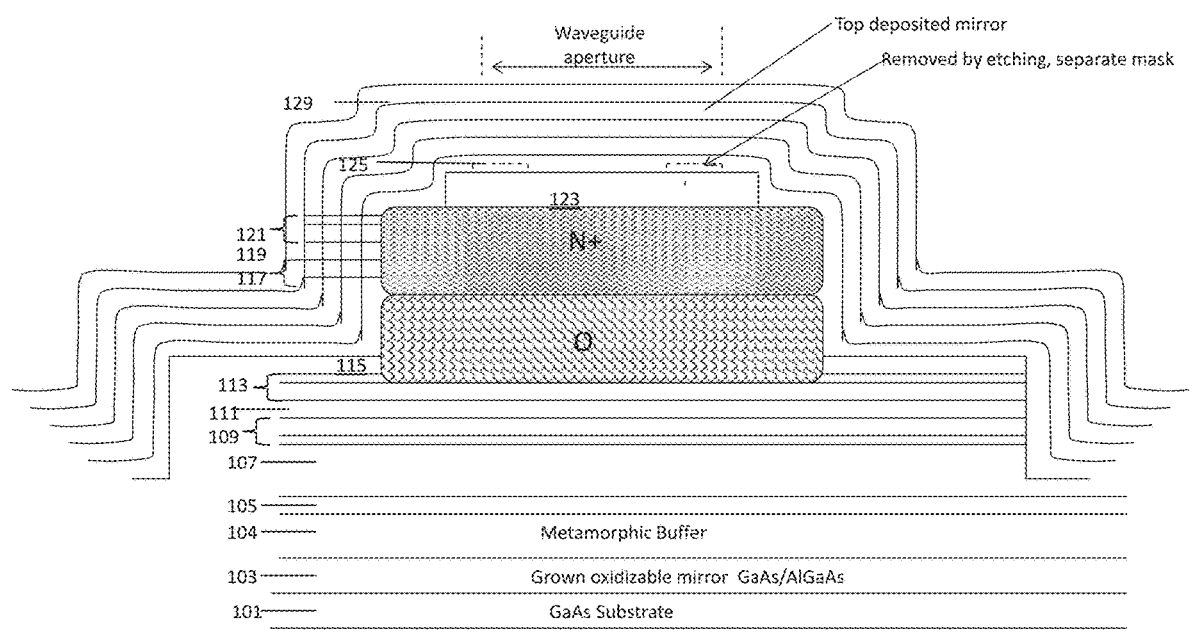

FIGS. 16-18 illustrate waveguide optical detectors, optical modulators, and optical amplifiers realized from the epitaxial layer structure and fabrication methodology as described herein.

Figure 19:
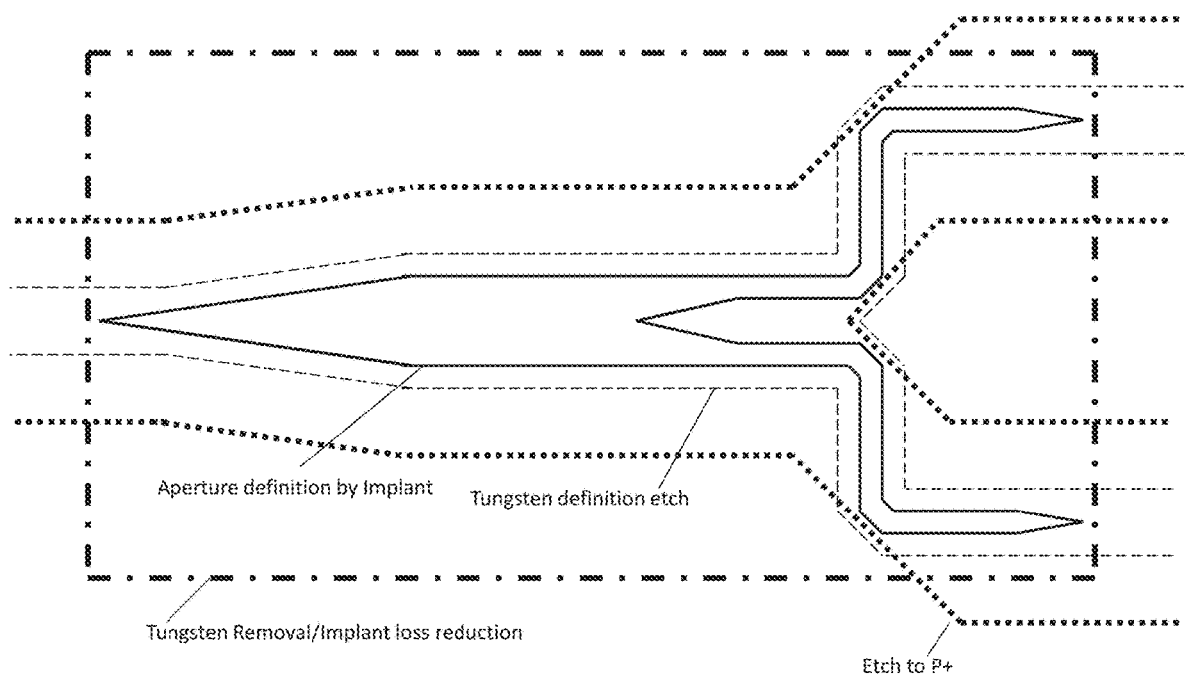

FIG. 19 illustrates a waveguide splitter or waveguide combiner realized from the epitaxial layer structure and fabrication methodology as described herein.

Figure 20:
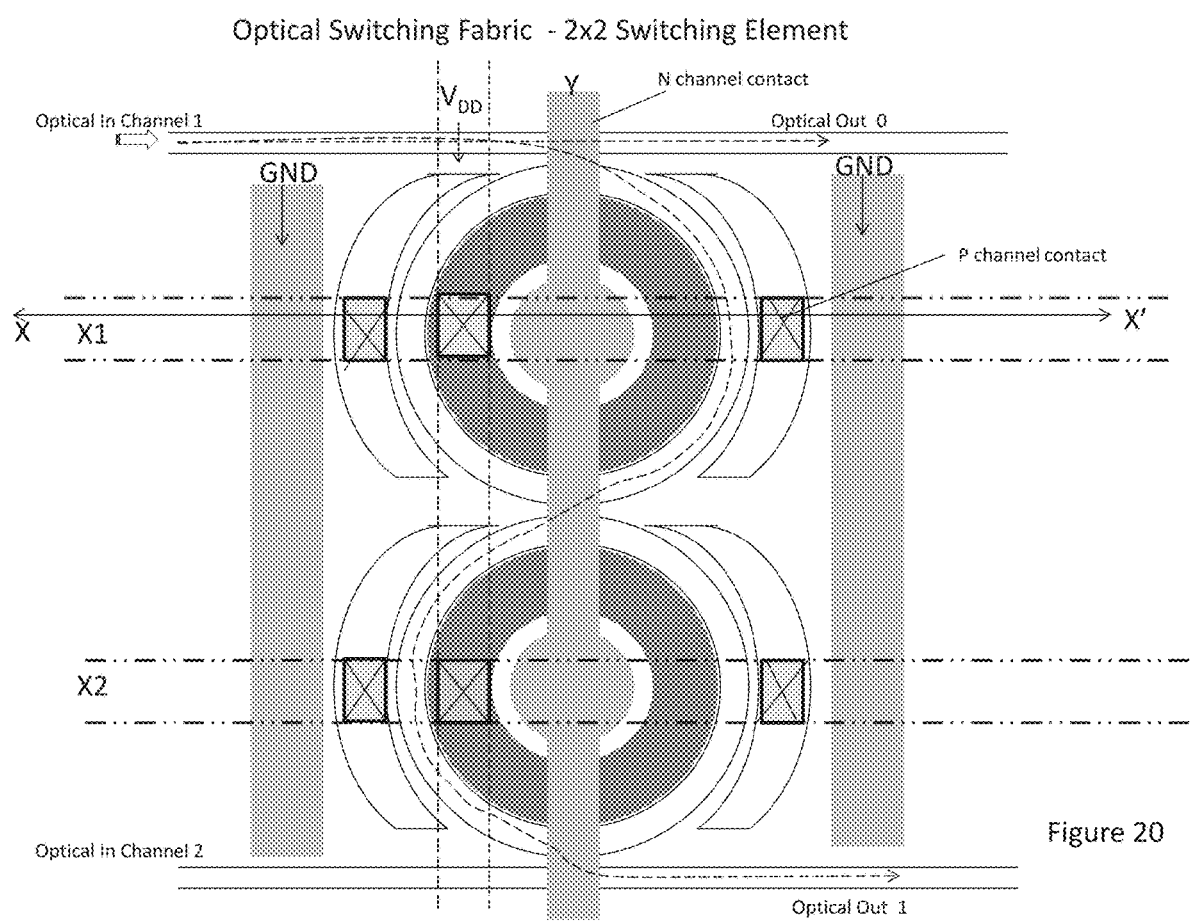

FIG. 20 illustrates an optical switching fabric (with 2×2 optical switching elements) realized from the epitaxial layer structure and fabrication methodology as described herein.

Figure 21:
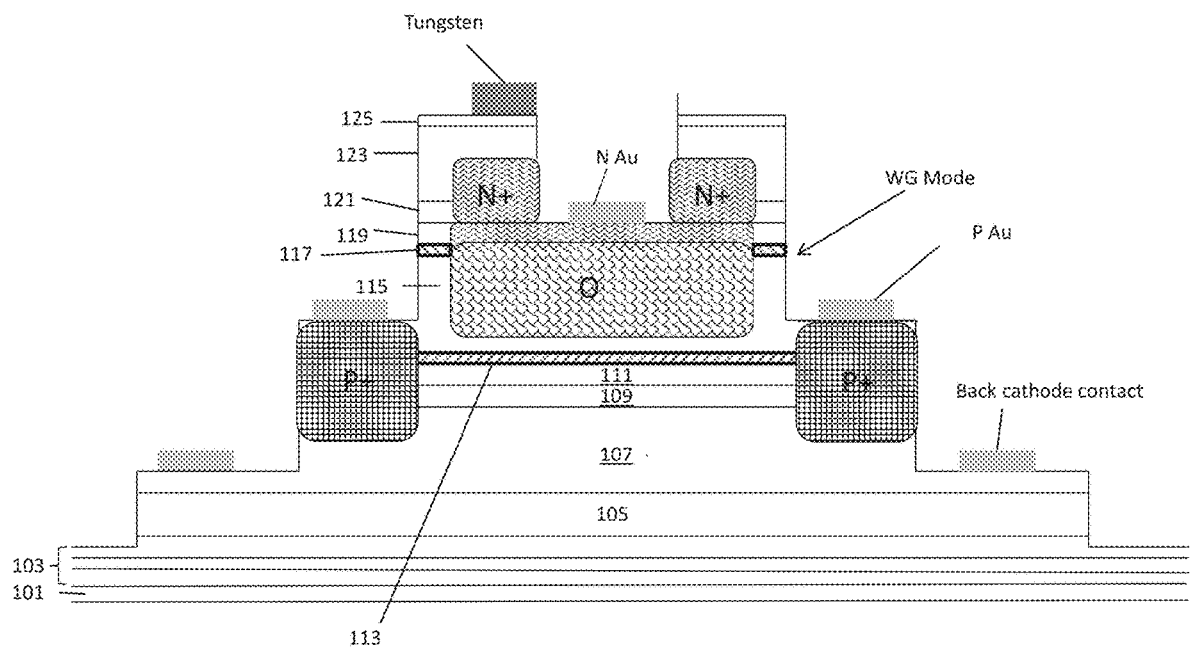

FIG. 21 illustrates a thyristor optical switching node (or a generalized thyristor whispering gallery mode laser) realized from the epitaxial layer structure and fabrication methodology as described herein.

Figure 22:
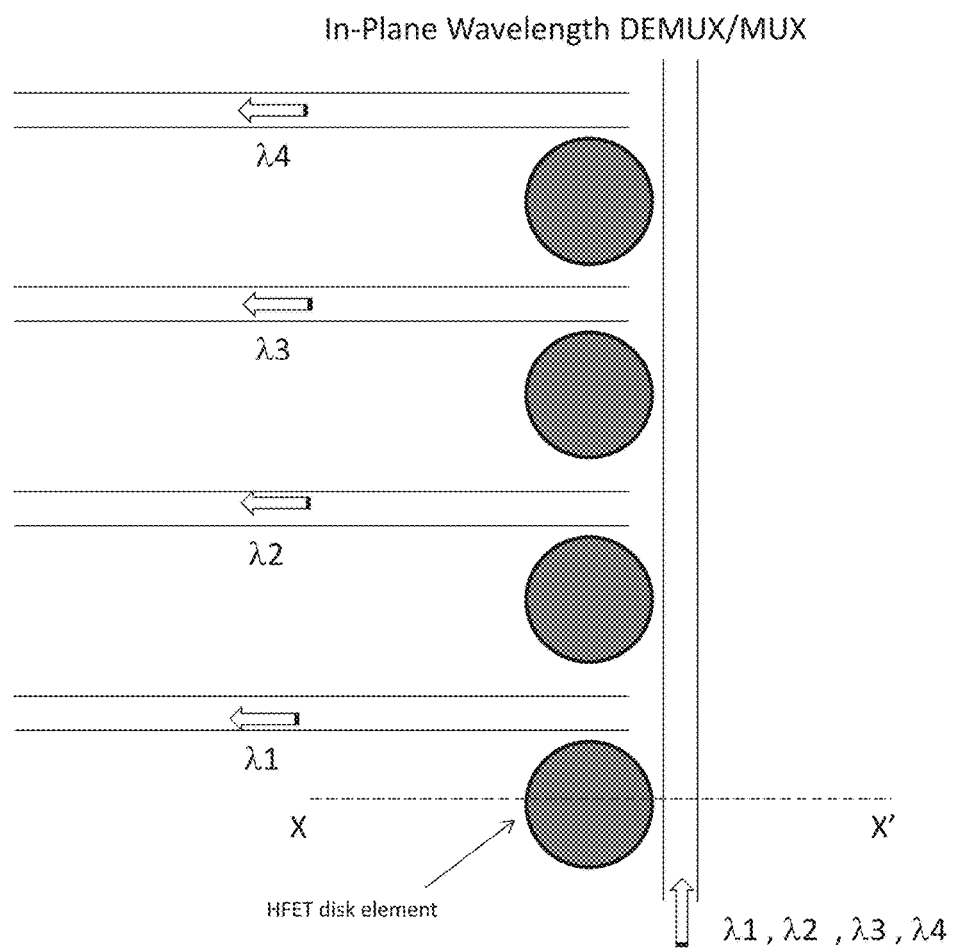
Figure 23:
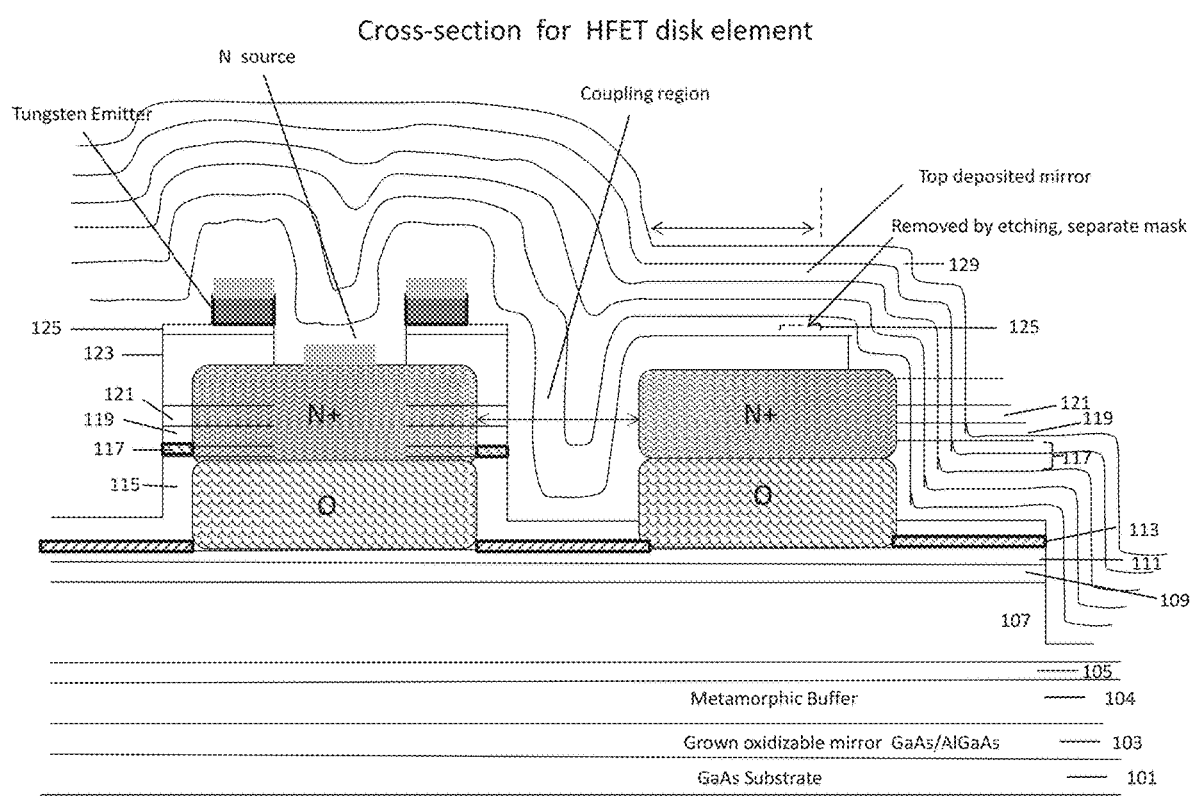

FIGS. 22 and 23 illustrate an array of in-plane wavelength demultiplexers (or array of in-plane wavelength multiplexers) realized from the epitaxial layer structure and fabrication methodology as described herein.

For thyristor laser devices, the device structure switches from a non-conducting/OFF state (where the current I through the device is substantially zero) to a conducting/ON state (where current I is substantially greater than zero) when i) the anode terminal electrode is forward biased with respect to the cathode terminal electrode and ii) the voltage between n-channel source electrode and the anode electrode is biased such that charge is produced in the n-type modulation doped QW structure 117 that is greater than the critical switching charge $Q_{CR}$, which is that charge that reduces the forward breakdown voltage such that no off state bias point exists. The voltage between the p-channel source electrode and the cathode electrode can also be configured to produce a charge in the p-type modulation doped QW structure 113 that is greater than the critical switching charge $Q_{CR}$. The critical switching charge $Q_{CR}$ is unique to the geometries and doping levels of the device. The device switches from the conducting/ON state (where the current I is substantially greater than zero) to a non-conducting/OFF state (where current I is substantially zero) when the current I through device falls below the hold current of the device for a sufficient period of time such that the charge in the n-type modulation doped QW structure 117 (or the charge in the p-type modulation doped QW structure 113) decreases below the holding charge $Q_H$, which is the critical value of the channel charge which will sustain holding action. Thus, if the anode terminal electrode is forward biased with respect to the cathode terminal electrode and the n-channel source electrode (and/or the p-channel source electrode) is biased to produce the critical switching charge $Q_{CR}$ in the n-type modulation doped QW structure 117 (or in the p-type modulation doped QW structure 113), then the device will switch to its conducting/ON state. If the current I in the conducting/ON state is above the threshold for lasing $I_{TH}$, then photon emission will occur within the device structure. For the vertical cavity surface emitting laser, the photon emission within the device structure produces the optical mode that is emitted vertically through the top surface of the device structure. For the whispering gallery microresonator, the photon emission within the device structure produces the whispering gallery mode signal that circulates in the waveguide region of the whispering gallery microresonator. For the closed-loop microresonator, the photon emission within the device structure produces the optical mode signal that circulates in the closed-loop waveguide of the closed-loop microresonator.

For the thyristor detector, the device structure switches from a non-conducting/OFF state (where the current I through the device is substantially zero) to a conducting/ON state (where current I is substantially greater than zero) in response to an input optical signal that produces charge in the n-type modulation doped QW structure 117 and/or the p-type modulation doped QW structure 113 resulting from photon absorption of the input optical signal. Specifically, the anode terminal electrode is forward biased with respect to the cathode terminal electrode and the voltage between n-channel source electrode and the anode electrode (and/or the voltage between the p-channel source electrode and the cathode terminal electrode) is biased such that that charged produced in the n-type modulation doped QW structure 113 (and/or the p-type modulation doped QW structure 117) resulting from photon absorption of the input optical pulse is greater than the critical switching charge $Q_{CR}$. When the input optical signal is removed, the device switches from the conducting/ON state (where the current I is substantially greater than zero) to a non-conducting/OFF state (where current I is substantially zero) when the charge in the n-type modulation doped QW structure 117 (and/or the p-type modulation doped QW structure 113) decreases below the holding charge $Q_H$. For the vertical cavity surface detector, the device structure absorbs the optical mode that is received vertically through the top surface of the device structure. For the whispering gallery microresonator, the device structure absorbs the whispering gallery mode that circulates in the waveguide region of the whispering gallery microresonator. For the closed-loop microresonator, the device structure absorbs the optical mode signal that circulates in the closed-loop waveguide of the closed-loop microresonator.

In some embodiments, a diffraction grating can be formed in the device structures described above to provide total reflection in an in-plane waveguide. In effect, the diffraction gating provides a mirror across the waveguide.

Figure 24:
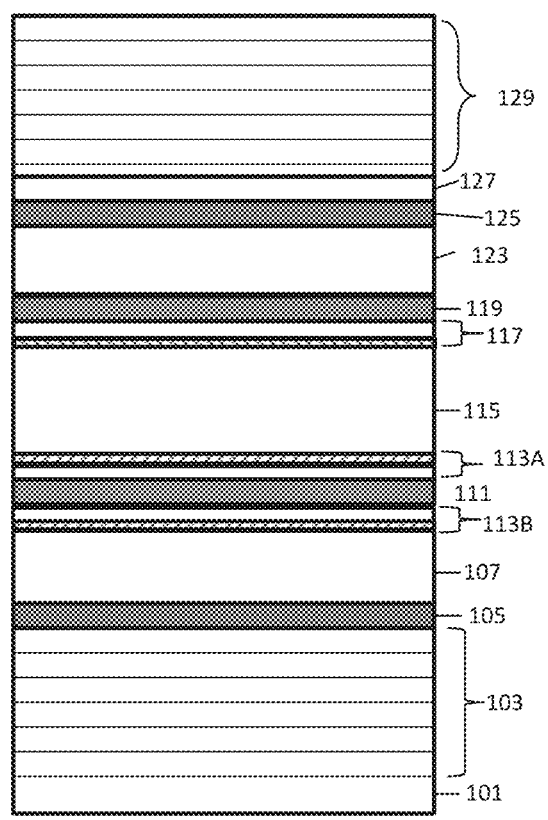
FIG. 24 is a schematic illustration of another exemplary epitaxial semiconductor layer structure for integrated circuit device structures described herein.

Turning now to FIG. 24, an epitaxial semiconductor layer structure is shown that is similar to the epitaxial semiconductor layer structure of FIG. 1 as described above except that layers 109, 111 and 113 of FIG. 1 are substituted by layers/structures 113B, 111 and 113A as shown. In this configuration, 113B is a non-inverted p-type modulation doped quantum well structure formed below an undoped spacer, 111 is a heavily-doped n-type layer, and 113A is an inverted p-type modulation doped quantum well structure formed above an undoped spacer layer. The non-inverted p-type modulation doped quantum well structure of 113B includes a p-type charge sheet offset above one or more pairs of quantum well layer and barrier layer by an undoped spacer layer. The inverted p-type modulation doped quantum well structure of 113A includes a p-type charge sheet offset below one or more pairs of quantum well layer and barrier layer by an undoped spacer layer. The heavily-doped n-type layer 111 is disposed between the p-type charge sheets of the two p-type modulation doped quantum well structures with respective undoped spacer layers therebetween. The heavily-doped n-type layer 111 forms a gate region (gate-all-around structure) for the separate quantum well channels of the inverted and non-inverted p-type modulation doped quantum well structures 113A, 113B. In this configuration, for the p-channel HFET device, an n-type gate contact ion implant region is formed in contact with the heavily-doped n-type layer 111, and the gate electrode of the p-channel HFET device is formed on the n-type gate contact ion implant region. P-type ion implant regions can extend into and through the layers/structures 113B, 111 and 113A to form the p-type source and drain contact ion implanted regions for the p-channel HFET device. Similarly, P-type ion implant regions can extend into and through the layers/structures 113B, 111 and 113A to form the p-type back-gate contact ion implanted region for the n-channel HFET device, the p-type collector contact ion implanted region for the P-P BICFET device, and the p-type p-channel contact ion implant regions for optoelectronic devices. For the N-N BICFET device, an n-type emitter contact ion implant region can be formed in contact with heavily-doped n-type layer 111, and the emitter electrode of the N-N BICFET device can be formed on the n-type emitter contact ion implant region.

It is also contemplated that the layer structure as described herein can include a metamorphic buffer structure formed on the substrate between the bottom mirror layer(s) and the bottom n-type layers of the active device structure. The metamorphic buffer structure can employ a plurality of layers that are configured to accommodate lattice strain due to mismatch between the active device structure and the substrate. An example of such a metamorphic buffer structure is described in U.S. patent application Ser. No. 14/222,841, filed on Mar. 24, 2014, herein incorporated by reference in its entirety.

There have been described and illustrated herein several embodiments of methods for forming integrated circuits that employ complementary modulation doped quantum well structures for both complementary transistor devices and optoelectronic devices that are integrally formed as part of the integrated circuit. While particular embodiments of the invention have been described, it is not intended that the invention be limited thereto, as it is intended that the invention be as broad in scope as the art will allow and that the specification be read likewise. Thus, while particular group III-V material system and heterostructures have been disclosed, it will be appreciated that other III-V material systems and heterostructures can be used to realize the optoelectronic integrated circuitry as described herein. It will therefore be appreciated by those skilled in the art that yet other modifications could be made to the provided invention without deviating from its spirit and scope as claimed.

What is claimed is:

1. A method of forming an integrated circuit comprising:
depositing or providing a plurality of semiconductor layers supported on a substrate, wherein the plurality of semiconductor layers includes i) at least one n-type layer, ii) an inverted p-type modulation doped quantum well structure formed above the at least one n-type layer, wherein the inverted p-type modulation doped quantum well structure includes at least one pair of quantum well layer and barrier layer disposed above a p-type charge sheet, iii) a non-inverted n-type modulation doped quantum well structure formed above the inverted p-type modulation doped quantum well structure, wherein the non-inverted n-type modulation doped quantum well structure includes an n-type charge sheet disposed above least one pair of quantum well layer and barrier layer, and iv) at least one p-type layer disposed above the non-inverted n-type modulation doped quantum well structure, wherein the at least one p-type layer includes a first p-type layer of a first concentration of p-type doping formed below a second p-type layer of a second concentration of p-type doping, wherein the first concentration of p-type doping of the first p-type layer is higher than the second concentration of p-type doping of the second p-type layer;
performing an etch operation (E1) into the plurality of semiconductor layers, wherein the etch operation (E1) exposes a portion of the second p-type layer;
implanting p-type ions into the second p-type layer as exposed by the etch operation (E1) to form a p-type gate implanted region in contact with the first p-type layer;
implanting n-type ions into the plurality of semiconductor layers to form an n-type source ion implanted region and an n-type drain ion implanted region which are both in contact with the non-inverted n-type modulation doped quantum well structure;

forming a gate electrode of a n-channel HFET device in contact with the p-type gate ion implanted region; and forming source and drain electrodes of the n-channel HFET device in contact with the n-type source ion implanted region and the n-type drain ion implanted region, respectively.

2. A method according to claim 1, further comprising:

performing thermal anneal operations that anneals the p-type gate ion implanted region, the n-type source ion implanted region, and the n-type drain ion implanted region of the n-channel HFET device before forming the gate electrode and the source and drain electrodes of the n-channel HFET device.

3. A method according to claim 1, further comprising:

forming a feature from a refractory metal, wherein the feature overlies a quantum well channel provided by the n-type modulation doped quantum well structure, wherein the n-type source ion implanted region and the n-type drain ion implanted region are disposed opposite one another along opposite sides of the feature, and the p-type gate ion implanted region is disposed adjacent one end of the feature.

4. A method according to claim 1, further comprising:

implanting p-type ions into the plurality of semiconductor layers to form a p-type back-gate ion implanted region which is in contact with the inverted p-type modulation doped quantum well structure; and forming a back-gate electrode of the n-channel HFET device in contact with the p-type back-gate ion implanted region.

5. A method according to claim 4, further comprising:

forming a feature from a refractory metal, wherein the feature overlies a quantum well channel provided by the n-type modulation doped quantum well structure, wherein the n-type source ion implanted region and the n-type drain ion implanted region are disposed opposite one another along opposite sides of the feature, and the p-type gate ion implanted region and the p-type back-gate ion implanted region are disposed opposite one another adjacent opposite ends of the feature.

6. A method according to claim 1, wherein:

the etch operation (E1) employs dry etching.

7. A method according to claim 1, wherein:

the first concentration of p-type doping of the first p-type layer is at least 7e18 $cm^{-3}$.

8. A method according to claim 1, wherein:

the first p-type layer is formed from an alloy of AlGaAs with p-type doping.

9. A method according to claim 1, wherein:

the first p-type layer is formed from $Al_{x1}Ga_{(1-x1)}As$, where the parameters x1 is 15%.

10. A method according to claim 1, wherein:

the first p-type layer has a thickness in the range of 200-300 Å.

11. A method according to claim 1, wherein:

the plurality of semiconductor layers further include an undoped spacer layer between the non-inverted n-type modulation doped quantum well structure of iii) and the at least one p-type layer of iv); and the n-type ions are implanted into the undoped spacer layer to form the n-type source ion implanted region and the n-type drain ion implanted region of the n-channel HFET device.

12. A method according to claim 1, further comprising:

implanting p-type ions into the second p-type layer as exposed by the etch operation (E1) to form a p-type emitter implanted region in contact with the first p-type layer;

implanting n-type ions into the plurality of semiconductor layers to form an n-type base ion implanted region in contact with the non-inverted n-type modulation doped quantum well structure;

implanting p-type ions into the plurality of semiconductor layers to form a p-type collector ion implanted region in contact with the inverted p-type modulation doped quantum well structure;

forming an emitter electrode of a P-P BICFET device in contact with the p-type emitter ion implanted region; and forming a base electrode of the P-P BICFET device in contact with the n-type base ion implanted region; and forming a collector electrode of the P-P BICFET device in contact with the p-type collector ion implanted region.

13. A method according to claim 12, wherein:

the base electrode and collector electrode of the P-P BICFET device have segments that are interdigitated with respect to one another.

14. A method according to claim 1, further comprising:

implanting p-type ions into the plurality of semiconductor layers to form a p-type source ion implanted region and a p-type drain ion implanted region which are both in contact with the inverted p-type modulation doped quantum well structure;

performing an etch operation (E2) into the plurality of semiconductor layers, wherein the etch operation (E2) exposes a portion of a layer above the n-type layer of i);

implanting n-type ions into the layer as exposed by the etch operation (E2) to form an n-type gate ion implanted region in contact with the n-type layer of i);

forming a gate electrode of a p-channel HFET device in contact with the n-type gate ion implanted region; and forming source and drain electrodes of the p-channel HFET device in contact with the p-type source ion implanted region and the p-type drain ion implanted region, respectively.

15. A method according to claim 14, further comprising:

performing thermal anneal operations that anneals the n-type gate ion implanted region, the p-type source ion implanted region, and the p-type drain ion implanted region of the p-channel HFET device before forming the gate electrode and the source and drain electrodes of the p-channel HFET device.

16. A method according to claim 14, further comprising:

forming an additional feature from a refractory metal, wherein the additional feature overlies a quantum well channel provided by the p-type modulation doped quantum well structure, wherein the p-type source ion implanted region and the p-type drain ion implanted region are disposed opposite one another along opposite sides of the additional feature, and the n-type gate ion implanted region is disposed adjacent one end of the additional feature.

17. A method according to claim 14, further comprising:

implanting n-type ions into the plurality of semiconductor layers to form an n-type back-gate ion implanted region which is in contact with the non-inverted n-type modulation doped quantum well structure; and forming a back-gate electrode of the p-channel HFET device in contact with the n-type back-gate ion implanted region.

18. A method according to claim 17, further comprising:

forming an additional feature from a refractory metal, wherein the additional feature overlies a quantum well channel provided by the p-type modulation doped quantum well structure, wherein the p-type source ion implanted region and the p-type drain ion implanted region are disposed opposite one another along opposite sides of the additional feature, and the n-type gate ion implanted region and the n-type back-gate ion implanted region are disposed opposite one another adjacent opposite ends of the additional feature.

19. A method according to claim 14, wherein:

the etch operation (E2) employs dry etching.

20. A method according to claim 14, wherein:

the n-type layer of i) has n-type doping of a concentration of at least $5 \times 10^{18} cm^{-3}$.

21. A method according to claim 14, wherein:

the n-type layer of i) is formed from gallium arsenide with n-type doping.

22. A method according to claim 14, wherein:

the plurality of semiconductor layers further include an undoped spacer layer between the inverted p-type modulation doped quantum well structure of ii) and the non-inverted n-type modulation doped quantum well structure of iii); and the p-type ions are implanted into the undoped spacer layer to form the p-type source ion implanted region and the p-type drain ion implant region of the p-channel HFET device.

23. A method according to claim 14, further comprising:

implanting n-type ions into the plurality of semiconductor layers to form an n-type collector ion implanted region in contact with the non-inverted n-type modulation doped quantum well structure;

implanting p-type ions into the plurality of semiconductor layers to form a p-type base ion implanted region in contact with the inverted p-type modulation doped quantum well structure;

implanting n-type ions into layer as exposed by the etch operation (E2) to form an n-type emitter implanted region in contact with the n-type layer of i);

forming a collector electrode of an N-N BICFET device in contact with the n-type collector ion implanted region and forming an emitter electrode of the N-N BICFET device in contact with the n-type emitter ion implanted region; and forming a base electrode of the N-N BICFET device in contact with the p-type base ion implanted region.

24. A method according to claim 23, wherein:

the base electrode and collector electrode of the N-N BICFET device have segments that are interdigitated with respect to one another.

25. A method according to claim 1, further comprising:

while forming n-channel HFET device, forming at least one optoelectronic device or optical device as part of the integrated circuit.

26. A method according to claim 1, wherein:

the plurality of semiconductor layers comprise III-V compound semiconductor materials, such as gallium arsenide semiconductor materials.

\* \* \* \* \*